United States Patent
Ou et al.

(10) Patent No.: US 12,453,192 B2
(45) Date of Patent: Oct. 21, 2025

(54) SINGLE-PHOTON AVALANCHE DIODE SEMICONDUCTOR DEVICE

(71) Applicant: Taiwan Semiconductor Manufacturing Company, Ltd., Hsinchu (TW)

(72) Inventors: Yu Ling Ou, Tainan (TW); Chia-Jung Hsu, Tainan (TW); Chia-Yu Wei, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 17/446,577

(22) Filed: Aug. 31, 2021

(65) Prior Publication Data
US 2023/0067986 A1    Mar. 2, 2023

(51) Int. Cl.
| | |
|---|---|
| *H10F 30/225* | (2025.01) |
| *H01L 21/762* | (2006.01) |
| *H10F 39/00* | (2025.01) |
| *H10F 39/18* | (2025.01) |

(52) U.S. Cl.
CPC ..... *H10F 30/225* (2025.01); *H01L 21/76224* (2013.01); *H10F 39/014* (2025.01); *H10F 39/18* (2025.01); *H10F 39/807* (2025.01)

(58) Field of Classification Search
CPC ............ H01L 31/107; H01L 21/76224; H01L 27/1463; H01L 27/14643; H01L 31/02327; H01L 31/18; H01L 31/02027; H01L 31/02162; H01L 21/762; H01L 29/66113; H01L 29/66159; H10F 30/225; H10F 39/014; H10F 39/18; H10F 39/807
See application file for complete search history.

(56) References Cited

U.S. PATENT DOCUMENTS

| | | | |
|---|---|---|---|
| 8,941,204 B2* | 1/2015 | Lin | H01L 27/1463 257/E21.573 |
| 9,412,774 B2* | 8/2016 | Choi | H01L 27/1463 |
| 9,799,702 B2 | 10/2017 | Cheng et al. | |
| 9,923,009 B1* | 3/2018 | Hsiung | H01L 27/14685 |
| 9,955,090 B2* | 4/2018 | Yang | H04N 25/778 |
| 11,316,063 B2* | 4/2022 | Roy | H01L 29/861 |
| 11,387,272 B2* | 7/2022 | Sugizaki | H01L 27/14621 |

(Continued)

OTHER PUBLICATIONS

Isamu Takai et al., "Single-Photon Avalanche Diode with Enhanced NIR-Sensitivity for Automotive LIDAR Systems," Sensors: MDPI, Mar. 30, 2016.

(Continued)

*Primary Examiner* — Eduardo A Rodela
(74) *Attorney, Agent, or Firm* — Harrity & Harrity, LLP

(57) ABSTRACT

A semiconductor device may include a single-photon avalanche diode (SPAD) arranged for illumination at a back surface of a substrate. The semiconductor device may include a full deep trench isolation (FDTI) structure between the SPAD and a neighboring SPAD of the semiconductor device. The FDTI may be associated with isolating the SPAD from the neighboring SPAD. The FDTI structure may include a shallow trench isolation (STI) element at the back surface of the substrate. The FDTI structure may include a deep trench isolation (DTI) element at a front surface of the substrate.

20 Claims, 27 Drawing Sheets

(56) References Cited

U.S. PATENT DOCUMENTS

| | | | |
|---|---|---|---|
| 11,616,152 B2* | 3/2023 | Borthakur | H01L 27/14629 |
| | | | 257/432 |
| 11,652,125 B2* | 5/2023 | Lee | H10F 39/8023 |
| | | | 257/292 |
| 2013/0285181 A1* | 10/2013 | Lin | H01L 27/1463 |
| | | | 257/E31.127 |
| 2017/0186798 A1 | 6/2017 | Yang et al. | |
| 2019/0252442 A1* | 8/2019 | Tanaka | H01L 27/14623 |
| 2022/0163674 A1* | 5/2022 | Matsumoto | H01L 27/146 |
| 2022/0293647 A1* | 9/2022 | Chou | H01L 27/14636 |

OTHER PUBLICATIONS

Chin-An Hsieh et al., "Photon-Detection-Probability Simulation Method for CMOS Single-Photon Avalanche Diodes," Sensors: MDPI, Jan. 13, 2020.

* cited by examiner

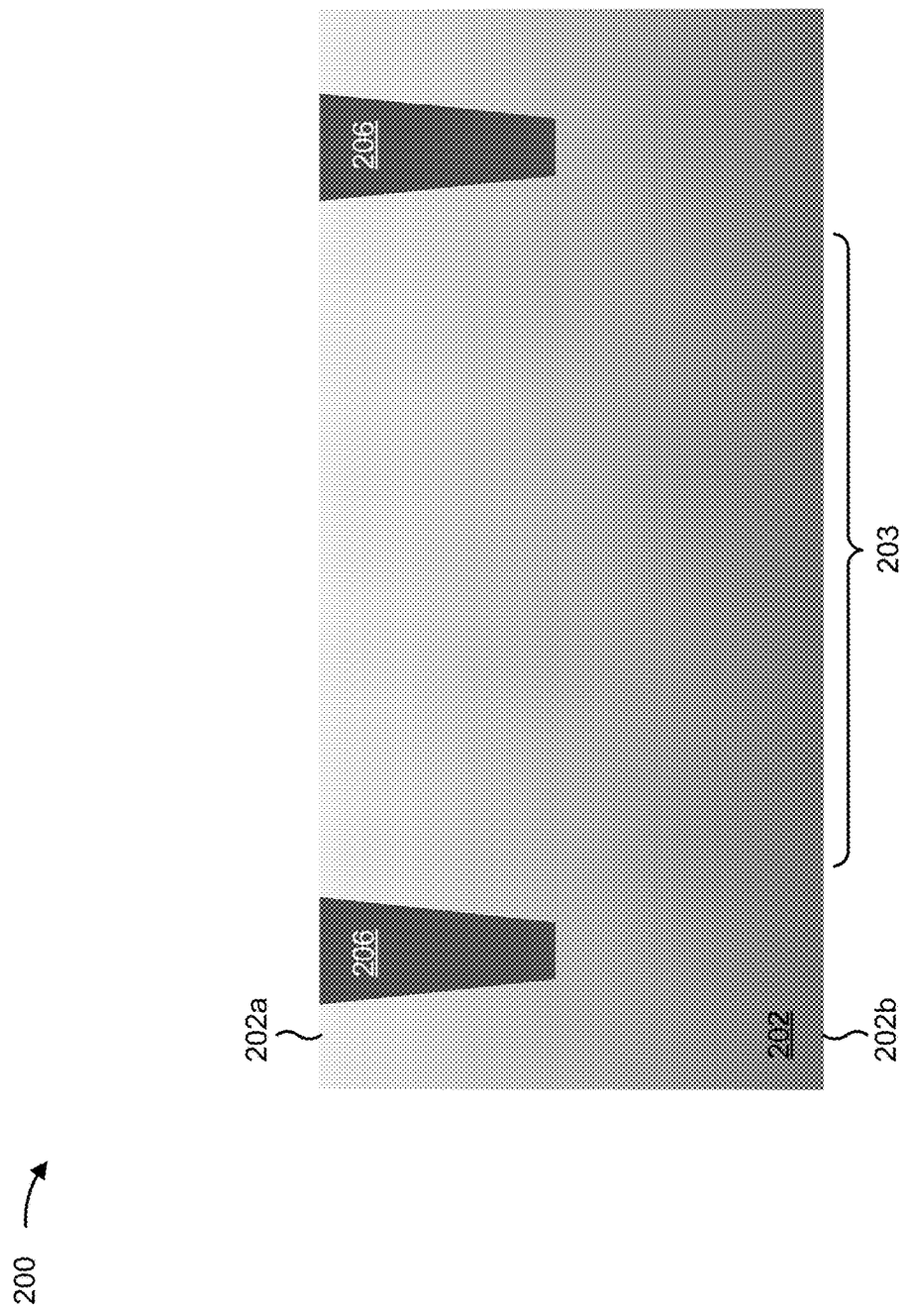

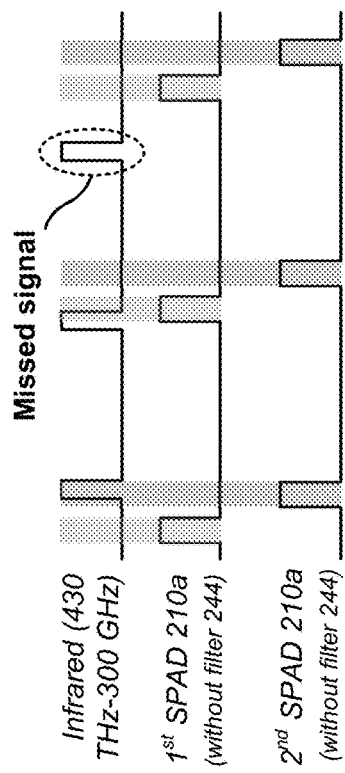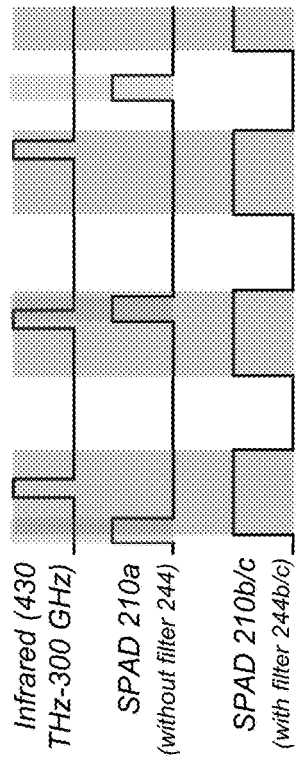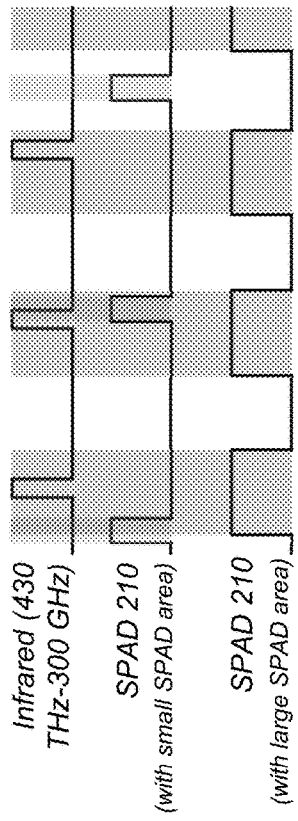

SINGLE-PHOTON AVALANCHE DIODE SEMICONDUCTOR DEVICE

BACKGROUND

An avalanche photodiode operating in a so-called Geiger mode, referred to as a single-photon avalanche diode (SPAD), is a highly sensitive photodetector capable of outputting a trigger signal upon detection of an ultralow-power signal, down to the single photon level. A SPAD can be used in, for example, a mobile front-end image sensor for light source detection or Light Detection and Ranging (LiDAR) in an automotive system, among other examples.

A SPAD image sensor includes an array of SPADs on a substrate. In operation, a given SPAD produces an output pulse when struck by a photon. Generally, the SPAD has a p-n junction that is reverse biased above a breakdown voltage such that a single photo-generated carrier can trigger an avalanche multiplication process that causes current at an output of a photon detection cell to rapidly reach a final value. This avalanche current continues until a quenching element quenches the avalanche process by reducing the bias voltage. An intensity of the photon signal received by the SPAD is obtained by counting a number of these output pulses within a window of time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are diagrams associated with an example of a semiconductor device including backside illuminated SPADs with FDTI structures and filters of differing thicknesses.

DETAILED DESCRIPTION

Figure 1:
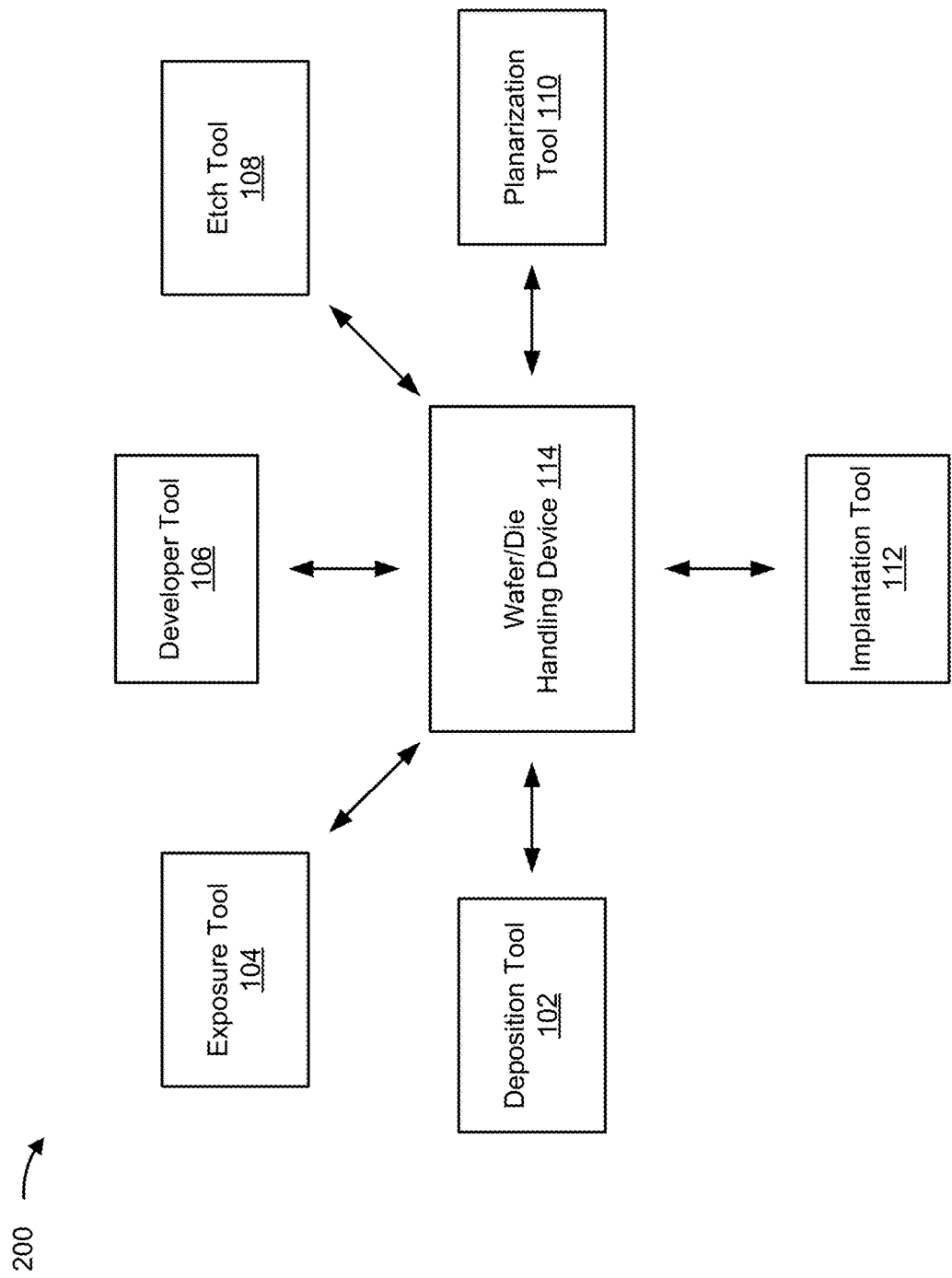
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "front," "back," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some image sensors, SPADs are configured for front side illumination (FSI), meaning that the SPADs are arranged to be photosensitive to light incident on a front surface of a substrate. For an image sensor including SPADs arranged for FSI, the majority of photon absorption occurs near the front surface of the substrate. In other image sensors, SPADs are configured for back side illumination (BSI), meaning that the SPADs are arranged to be photosensitive to light incident on a back surface of a substrate. For an image sensor including SPADs arranged for BSI, the majority of photon absorption occurs near the back surface of the substrate.

An important indicator for sensitivity of a SPAD is a photon-detection probability (PDP). A PDP defines a probability of a successful detection for a single photon incident on the SPAD. Notably, in a SPAD arranged for FSI (herein referred to as an FSI-SPAD), a PDP degrades for relatively long wavelengths of incident light due to blocking caused by metal routing on a front side of such an FSI-SPAD. Furthermore, optical crosstalk between neighboring SPADs (when incident light passes through a region of one SPAD at a non-orthogonal angle and is at least partially absorbed by a SPAD of an adjacent region) can degrade spatial resolution, reduce overall sensitivity, cause color mixing, and/or lead to image noise, which can result in intolerable errors in some applications, such as an automotive application or another type of application in which safety is a concern.

Some implementations described herein provide techniques and apparatuses for a SPAD arranged for BSI with full deep trench isolation. In some implementations, a semiconductor device includes a SPAD arranged for illumination at a back surface of a substrate and a full deep trench isolation (FDTI) structure. The FDTI structure is between the SPAD and a neighboring SPAD of the semiconductor device in order to provide isolation of the SPAD from the neighboring SPAD (e.g., to reduce or eliminate optical crosstalk). In some implementations, the FDTI structure includes a shallow trench isolation (STI) element at the back surface of the substrate and a deep trench isolation (DTI) element at a front surface of the substrate. Additional details are provided below.

In some implementations, because incident light is not blocked by metal routing in the SPAD arranged for BSI with FDTI (herein referred to as a BSI-SPAD with FDTI), PDP can be improved by approximately 30% as compared to an FSI-SPAD (with STI only). In some implementations, the BSI-SPAD with FDTI can be used in, for example, an application that uses infrared light and may provide high sharpness. For example, for 940 nanometer (nm) light, the BSI-SPAD with FDTI may achieve a modulation transfer function (MTF) of greater than 50% at a Nyquist frequency over 2 (Ny/2).

FIG. 1 is a diagram of an example environment 100 in which systems and/or methods described herein may be implemented. As shown in FIG. 1, environment 100 may include a plurality of semiconductor processing tools 102-112 and a wafer/die handling device 114. The plurality of semiconductor processing tools 102-112 may include a deposition tool 102, an exposure tool 104, a developer tool 106, an etch tool 108, a planarization tool 110, an implantation tool 112, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may deposit a metal material to form one or more conductors or conductive layers, may deposit an insulating material to form a dielectric or insulating layer, and/or the like as described herein. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, the polishing device may polish or planarize a layer of deposited or plated material. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the is rotated. The polishing pad may also be rotated to ensure a continuous supply of slurry is applied to the polishing pad.

The implantation tool 112 is a semiconductor processing tool that is used to implant ions into a substrate of a semiconductor wafer. In some implementations, the implantation tool 112 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. In some implementations, the implantation tool 112 can be used to form a SPAD in a substrate, as described herein.

Wafer/die handling device 114 includes a mobile robot, a robot arm, a tram or rail car, and/or another type of device that are used to handle wafers and/or dies and/or transport wafers and/or dies between semiconductor processing tools 102-112 and/or to and from other locations such as a wafer rack, a storage room, and/or the like. In some implementations, wafer/die handling device 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
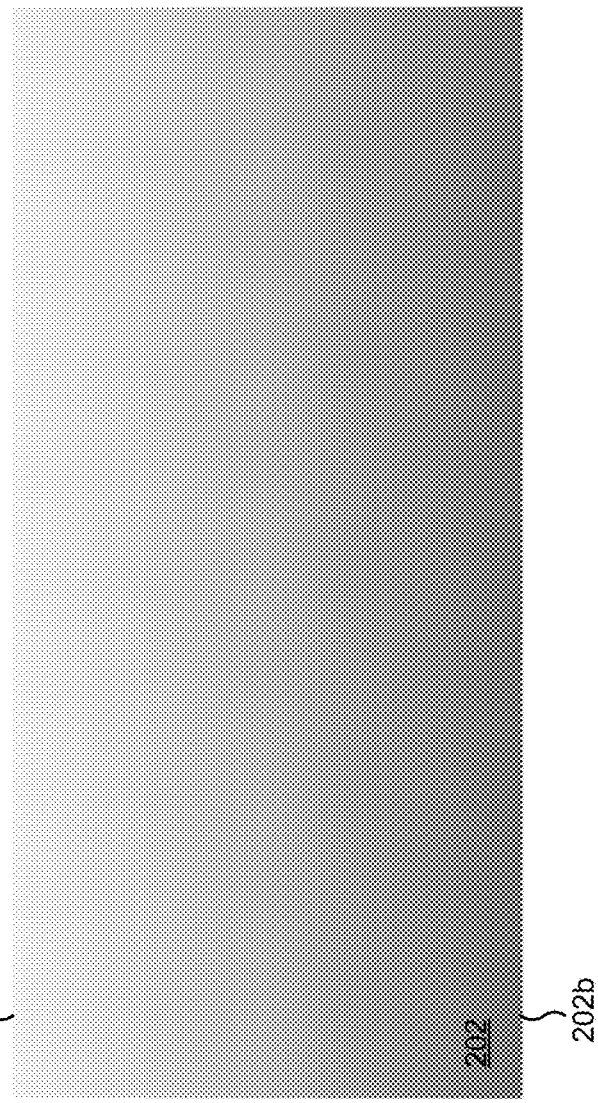
FIGS. 2A-2T are diagrams of an example of forming a semiconductor device including a backside illuminated SPAD with a full deep trench isolation (FDTI) structure, as described herein.
Figure 2B:
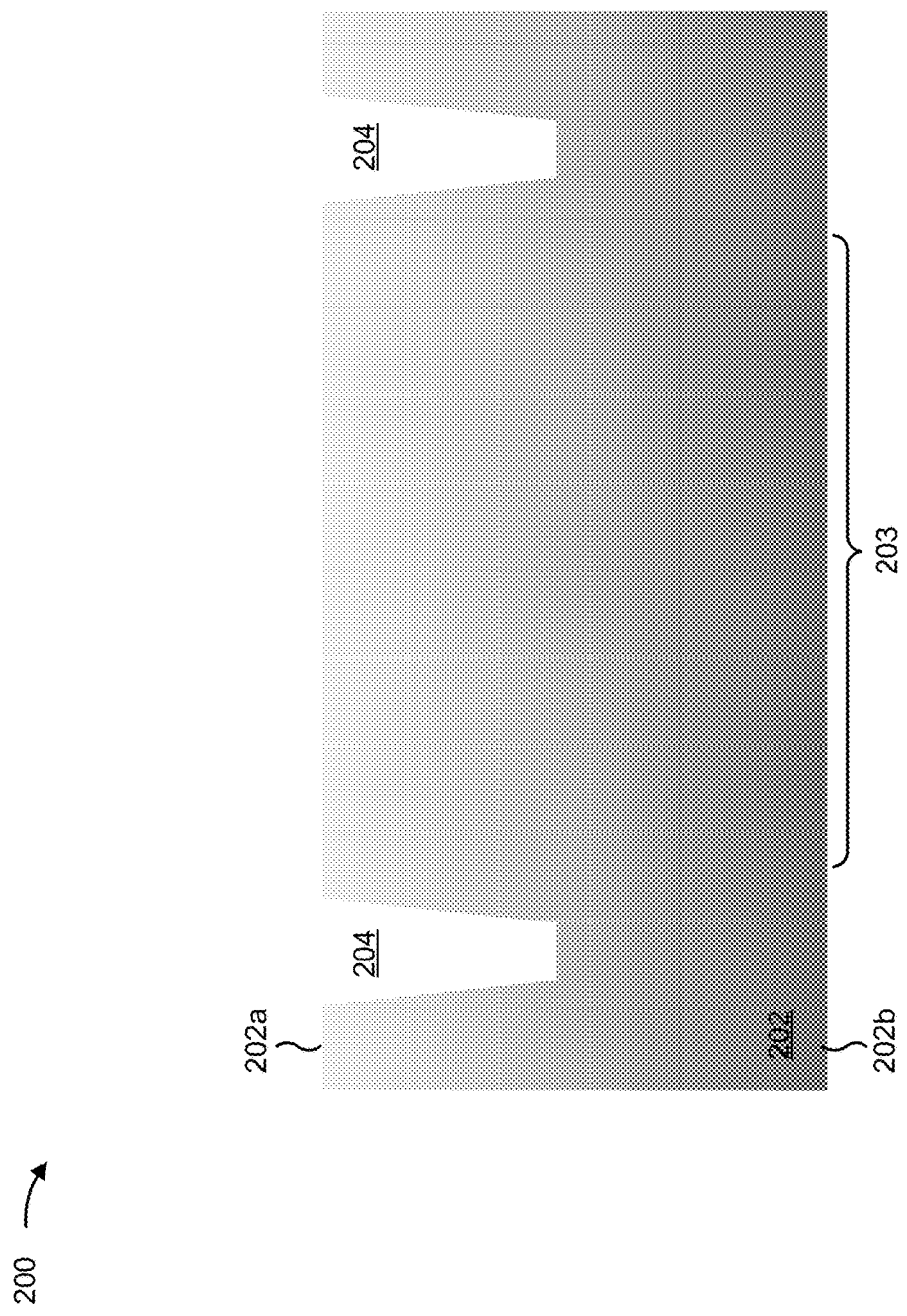
Figure 2D:
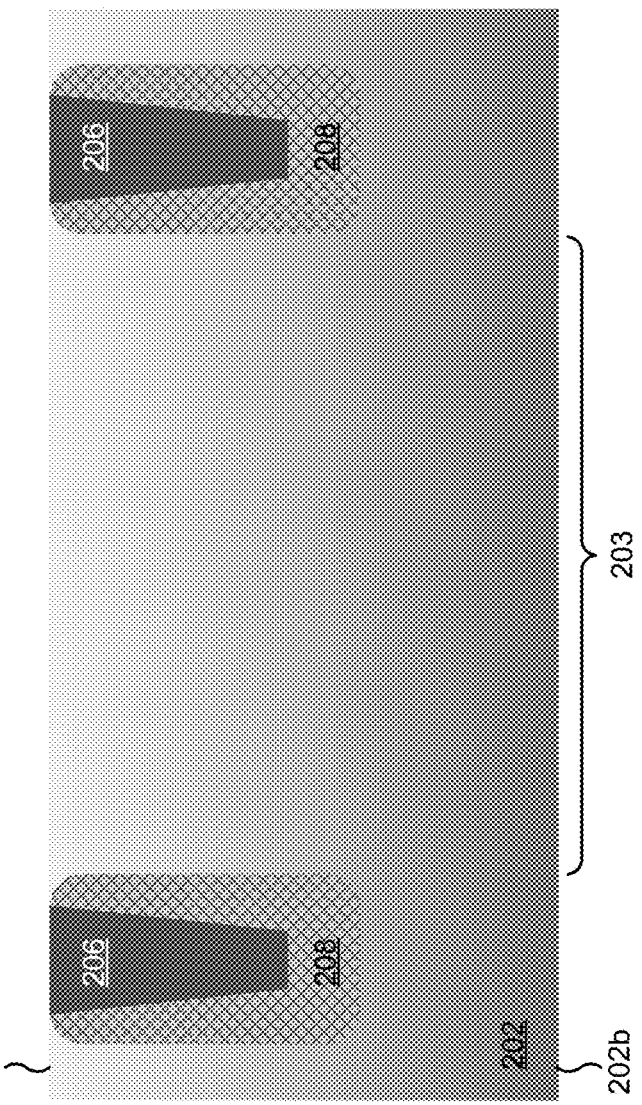
Figure 2E:
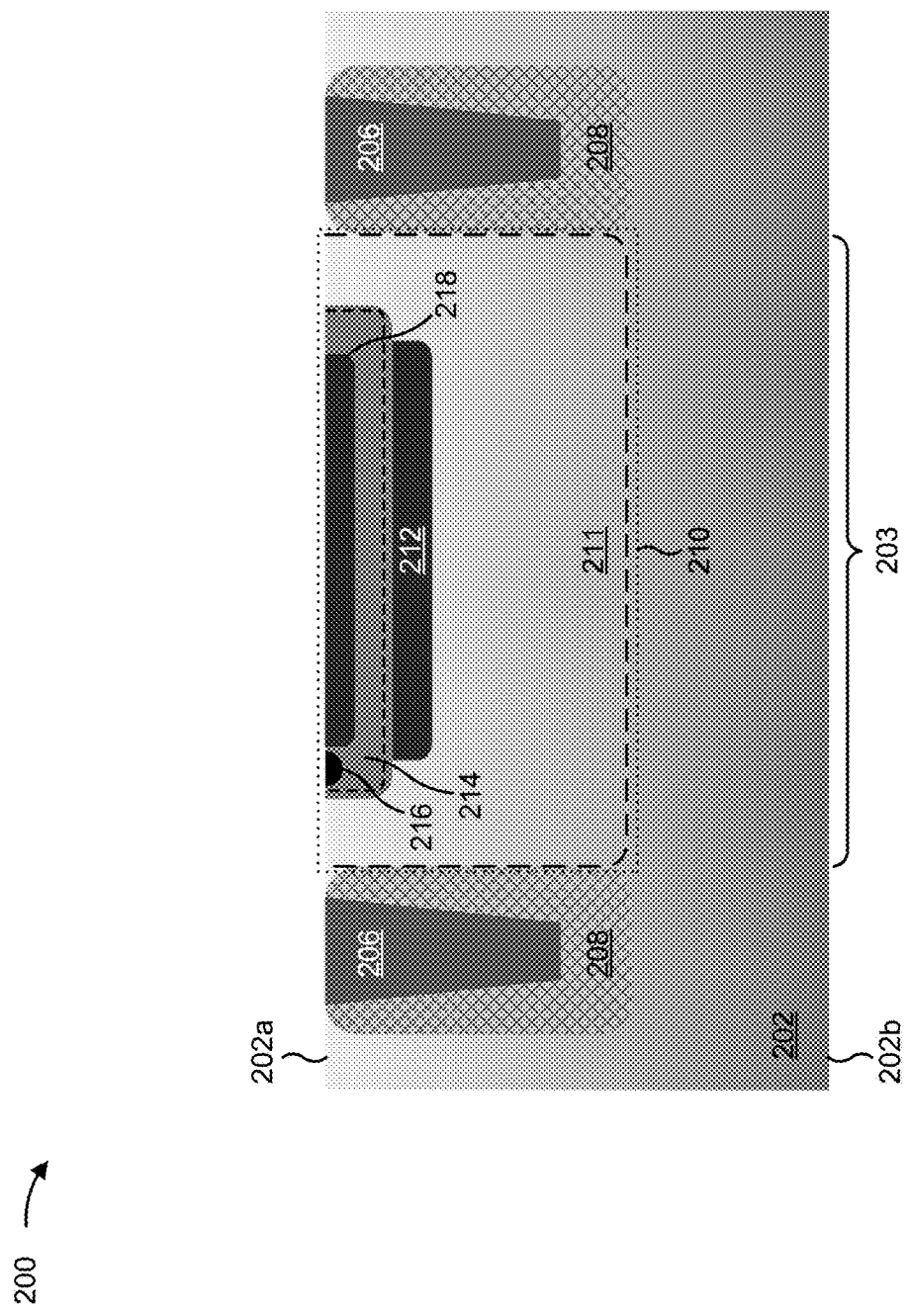
Figure 2F:
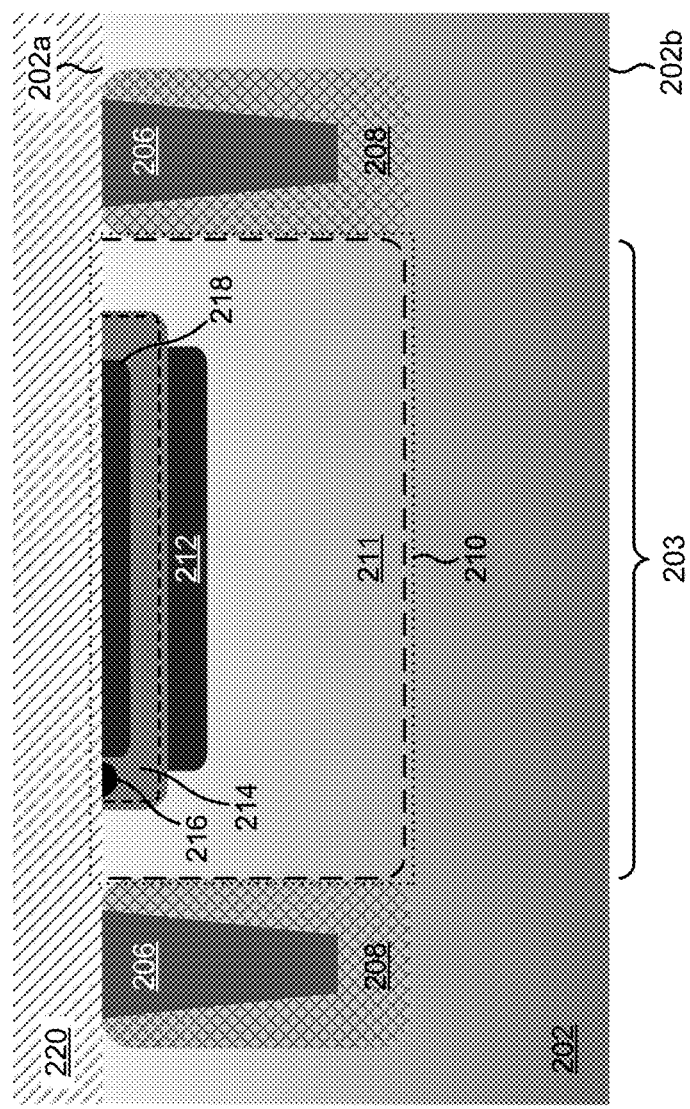
Figure 2G:
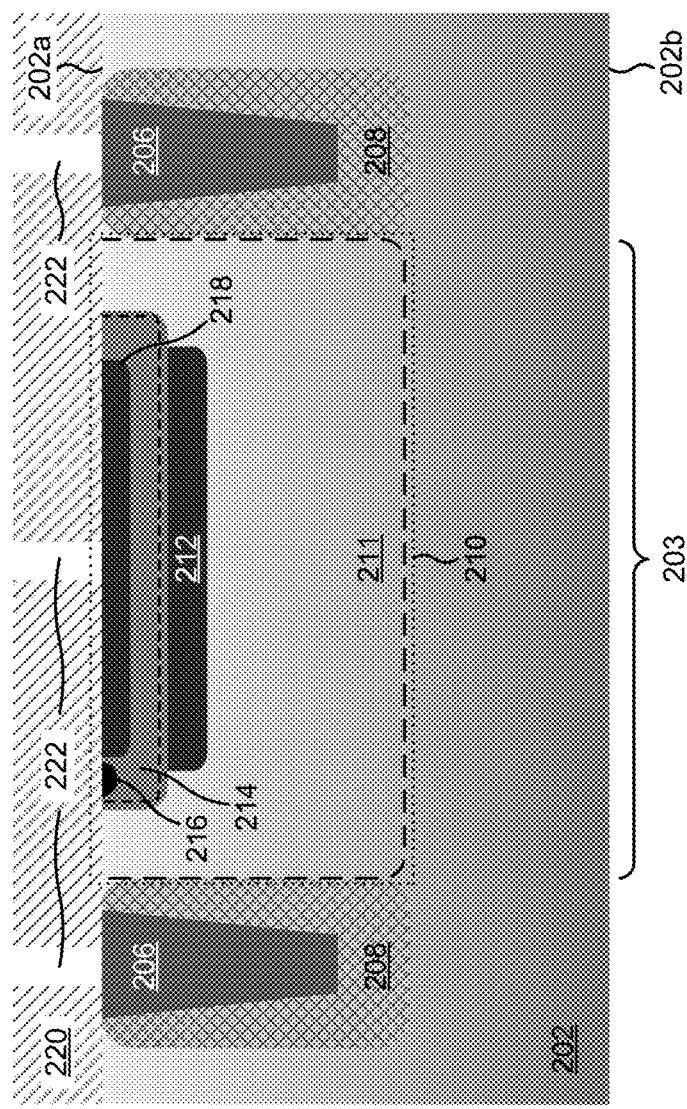
Figure 2H:
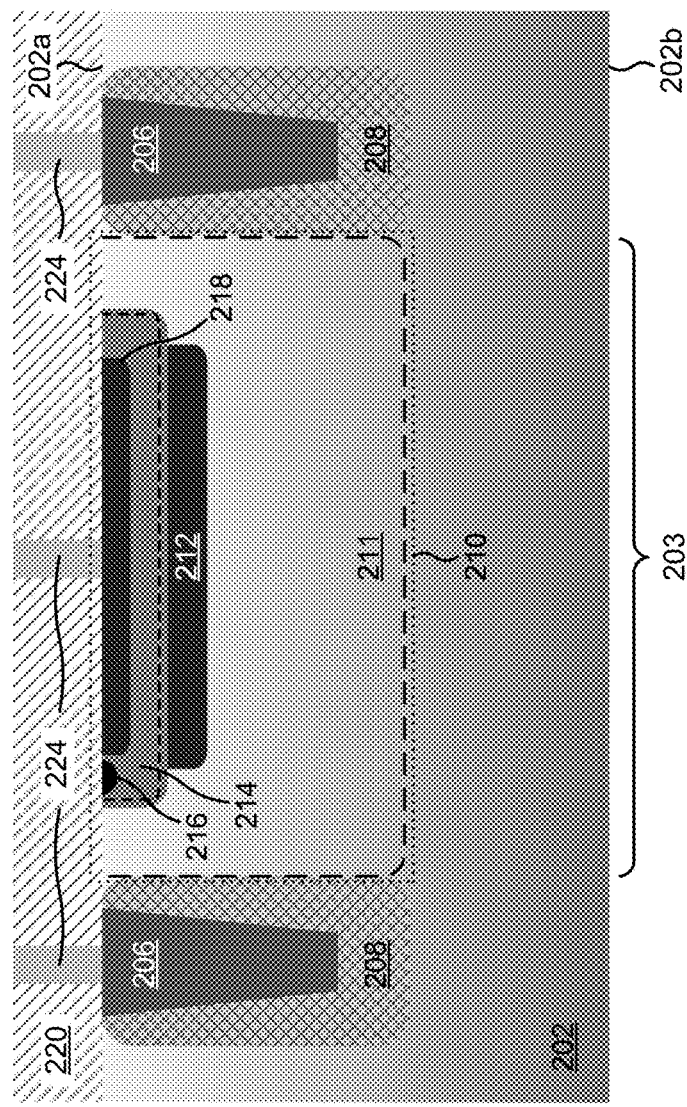
Figure 2I:
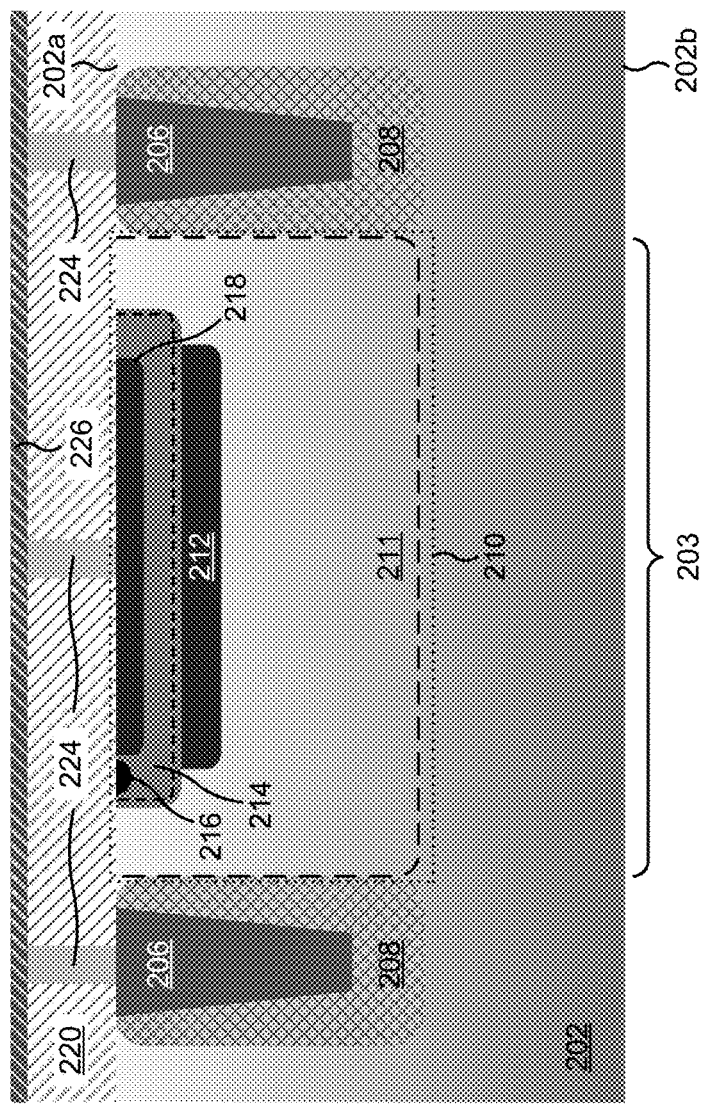
Figure 2J:
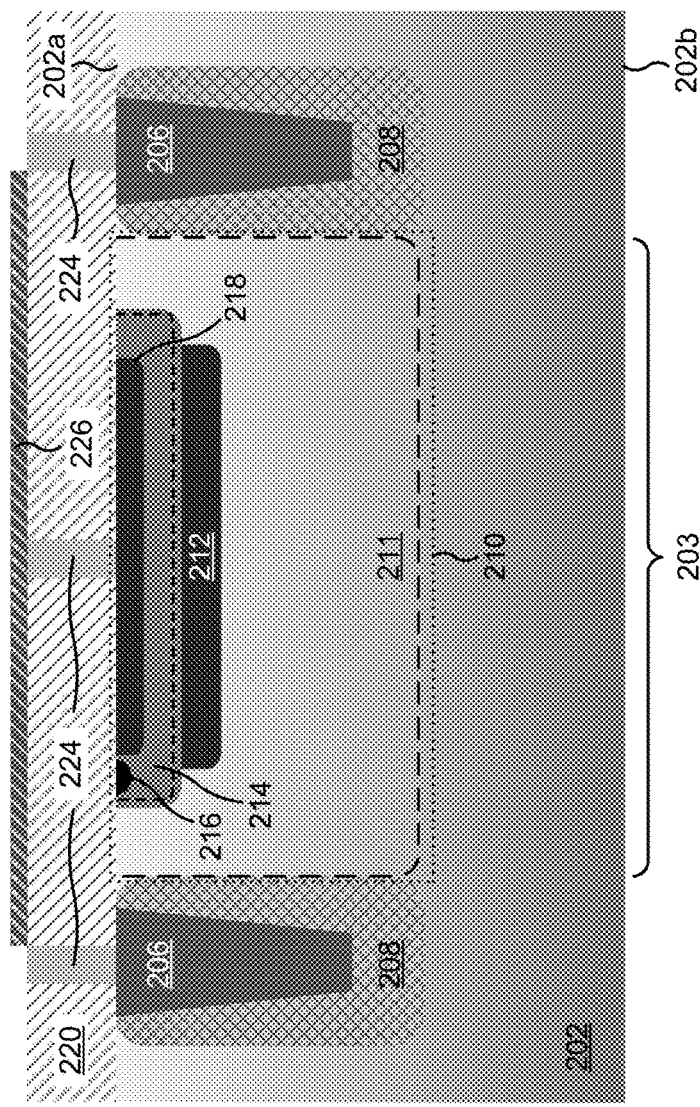
Figure 2K:
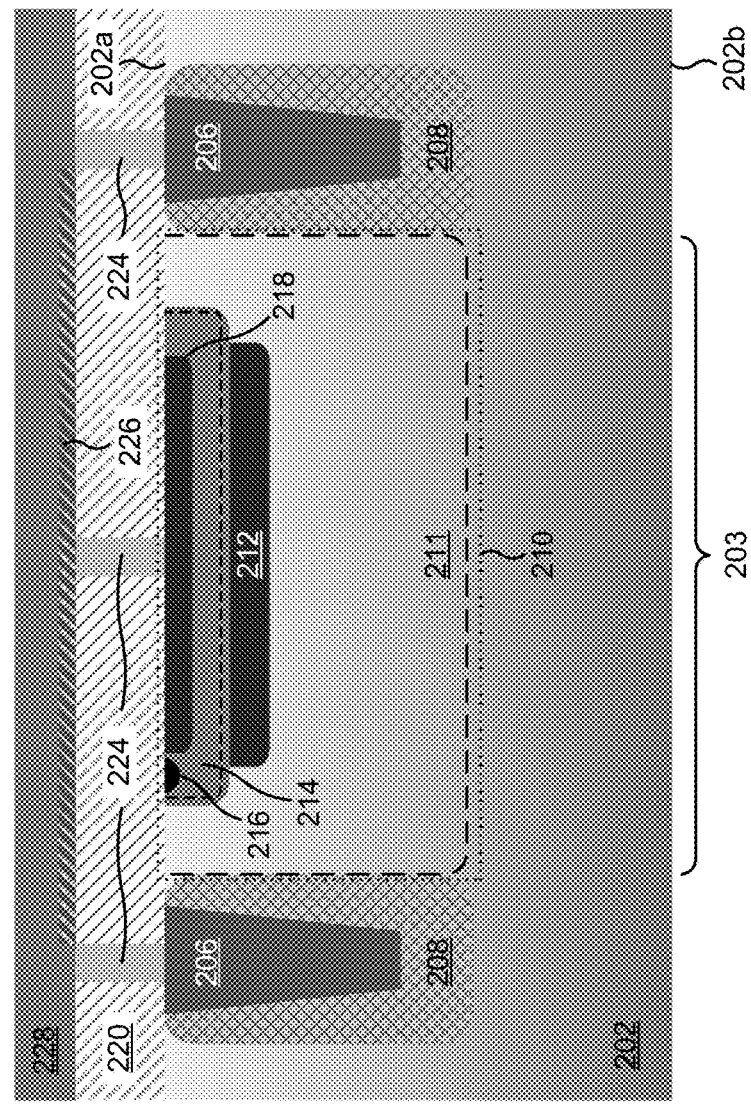
Figure 2L:
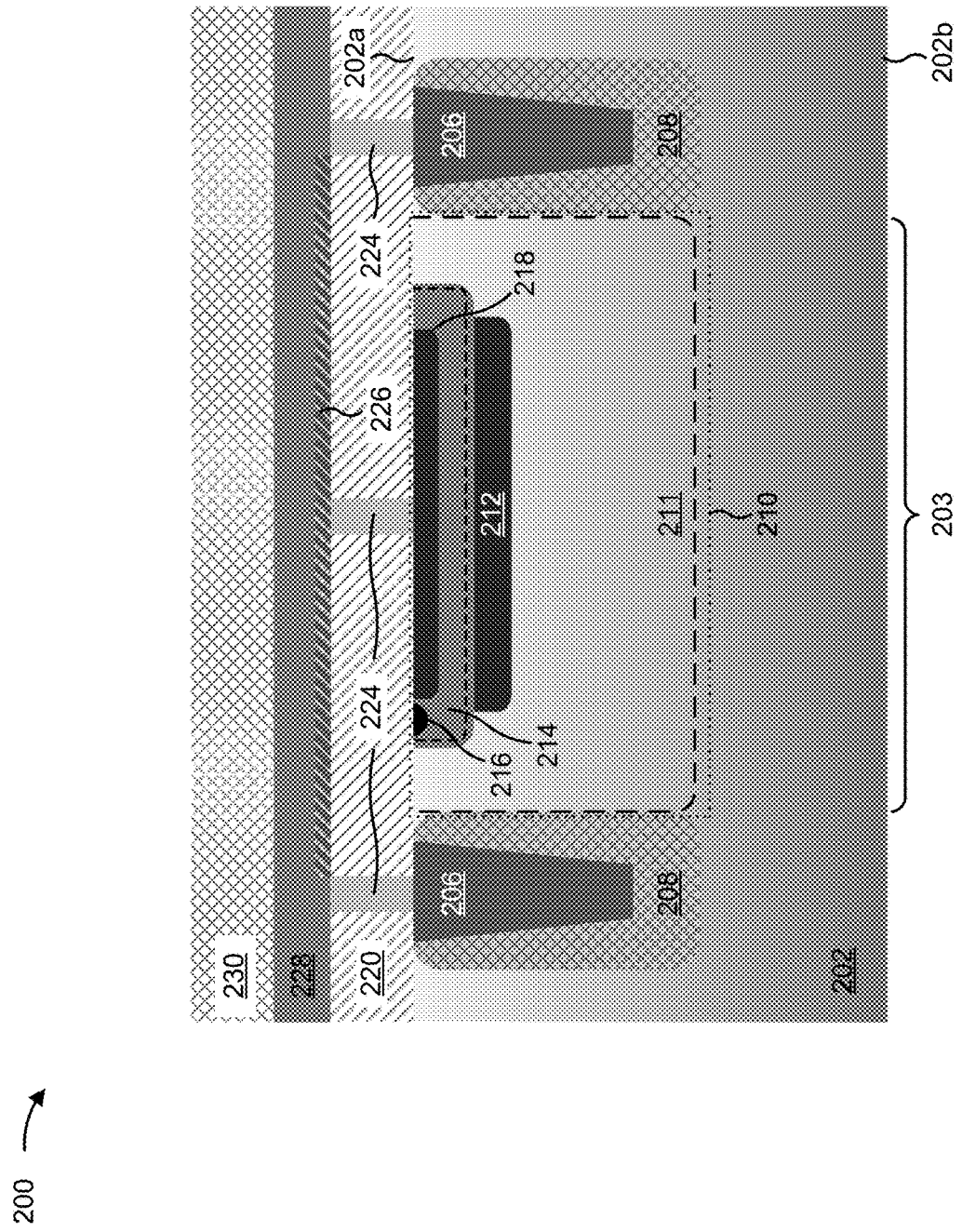
Figure 2M:
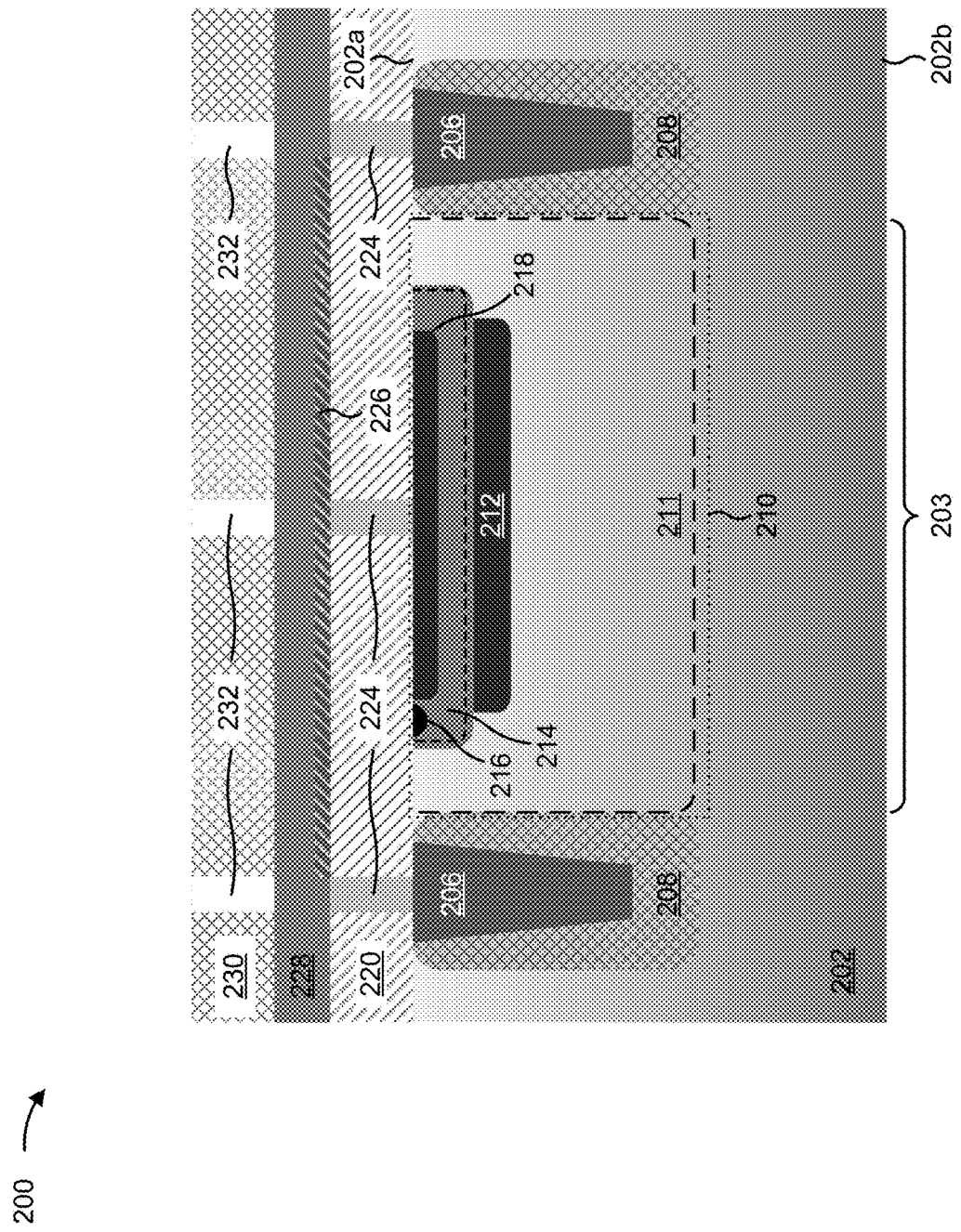
Figure 2N:
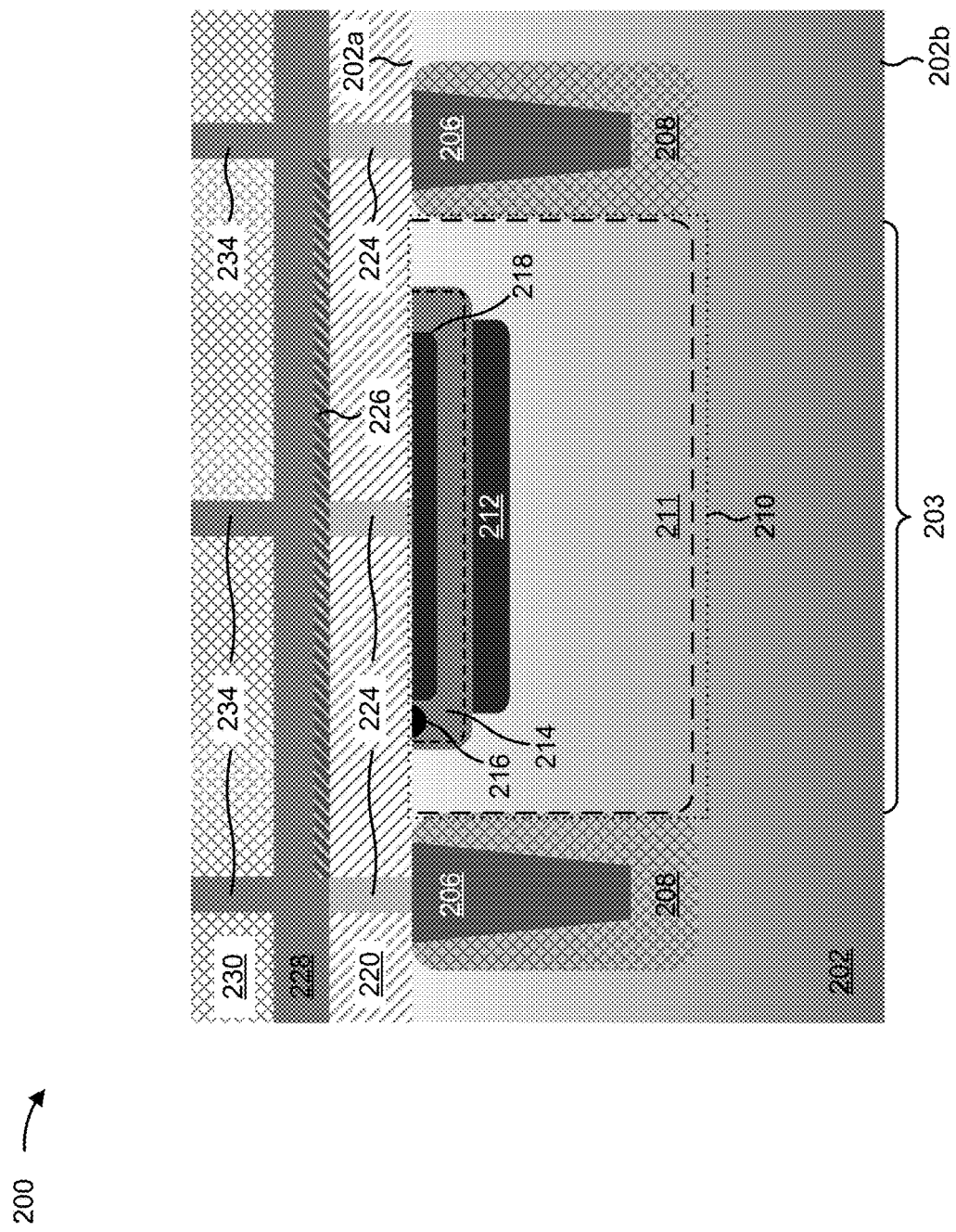
Figure 2O:
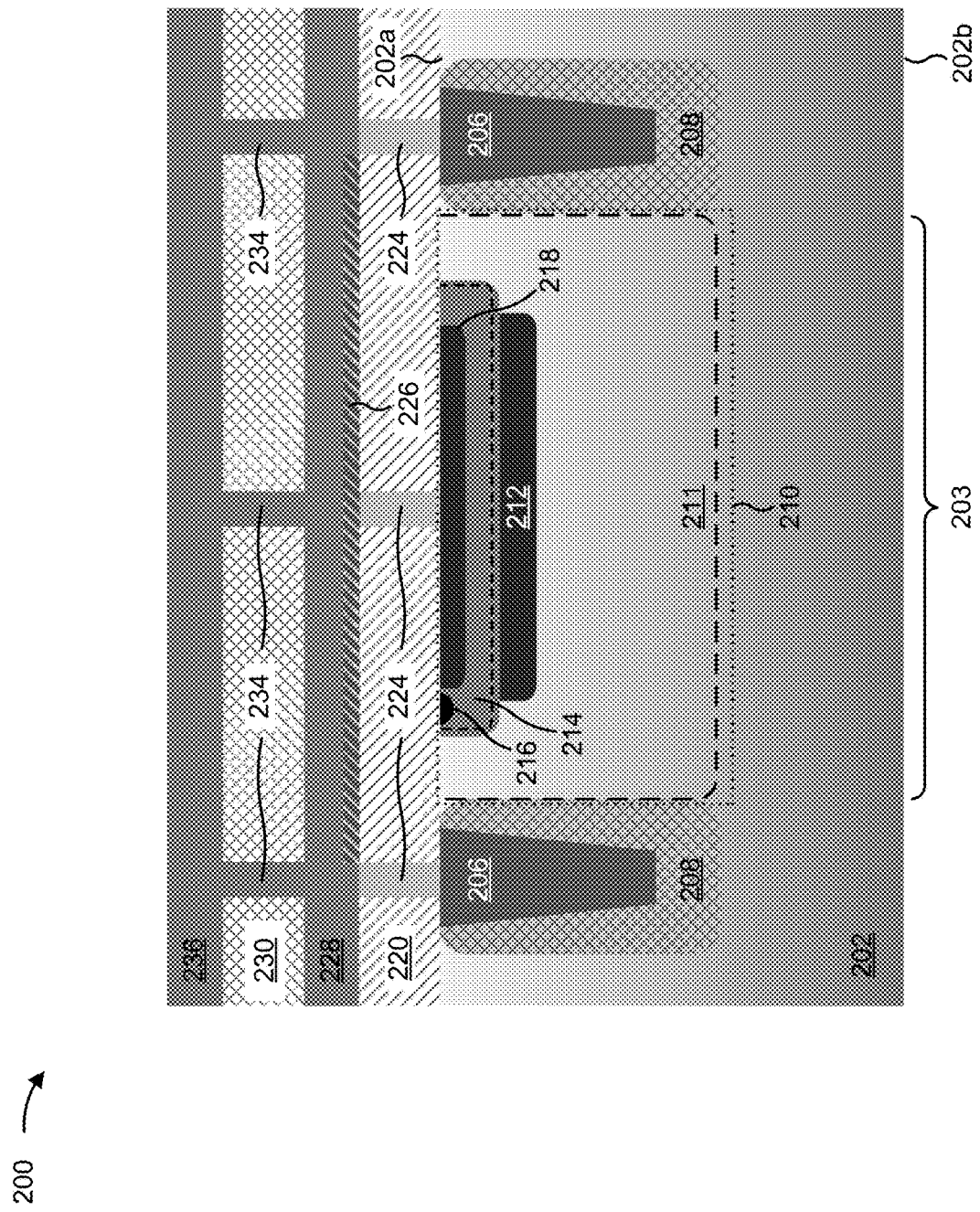
Figure 2P:
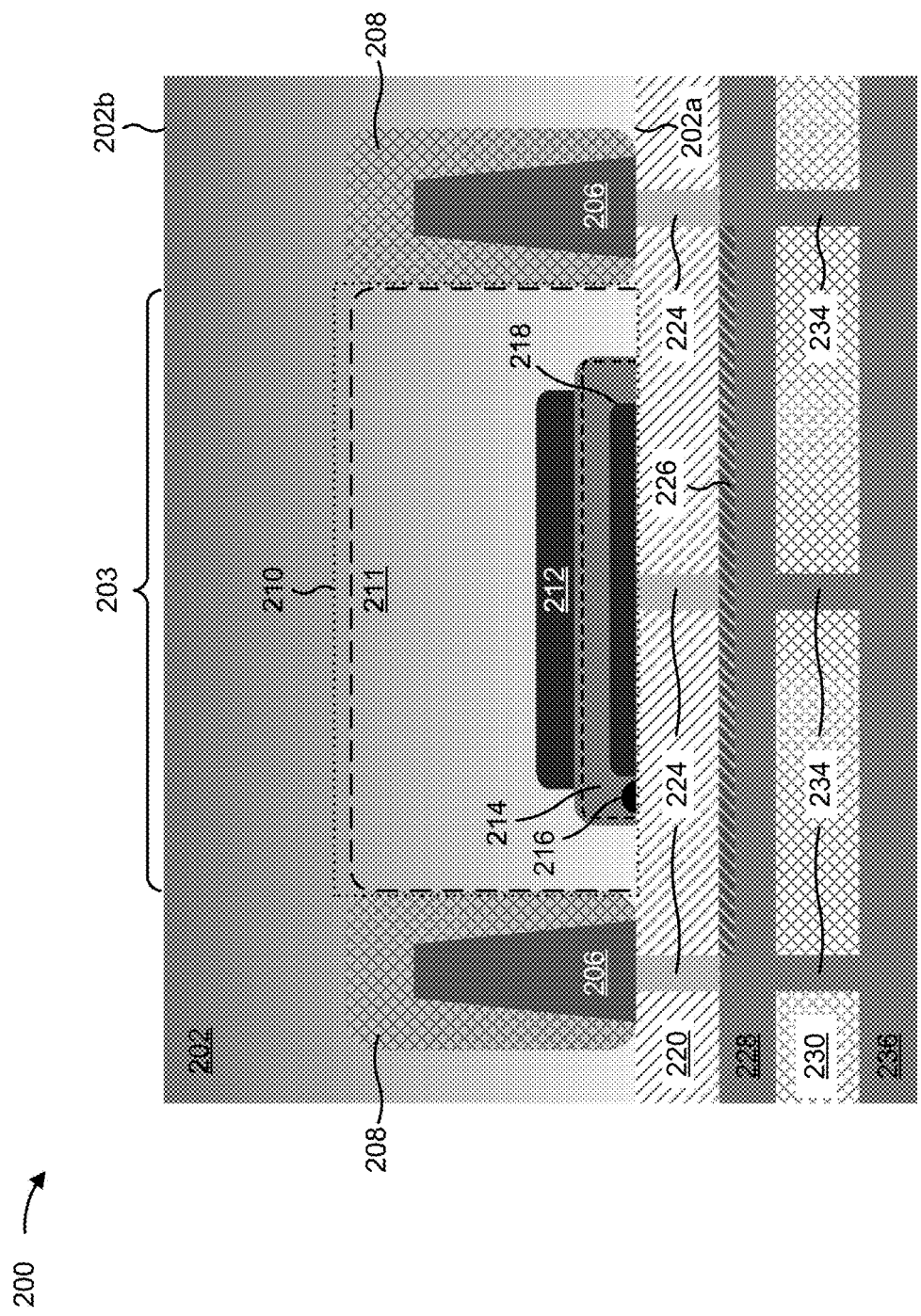
Figure 2Q:
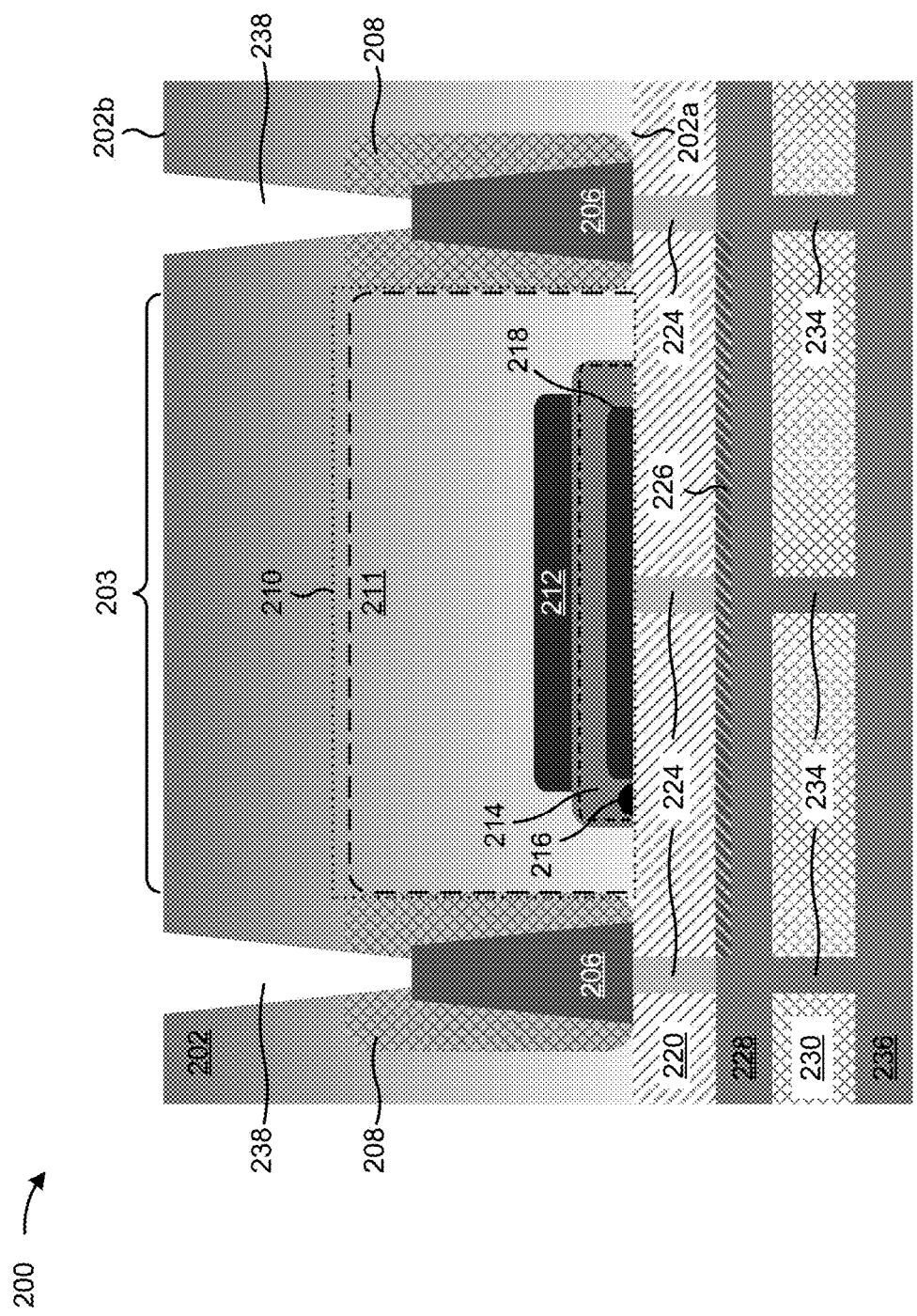
Figure 2R:
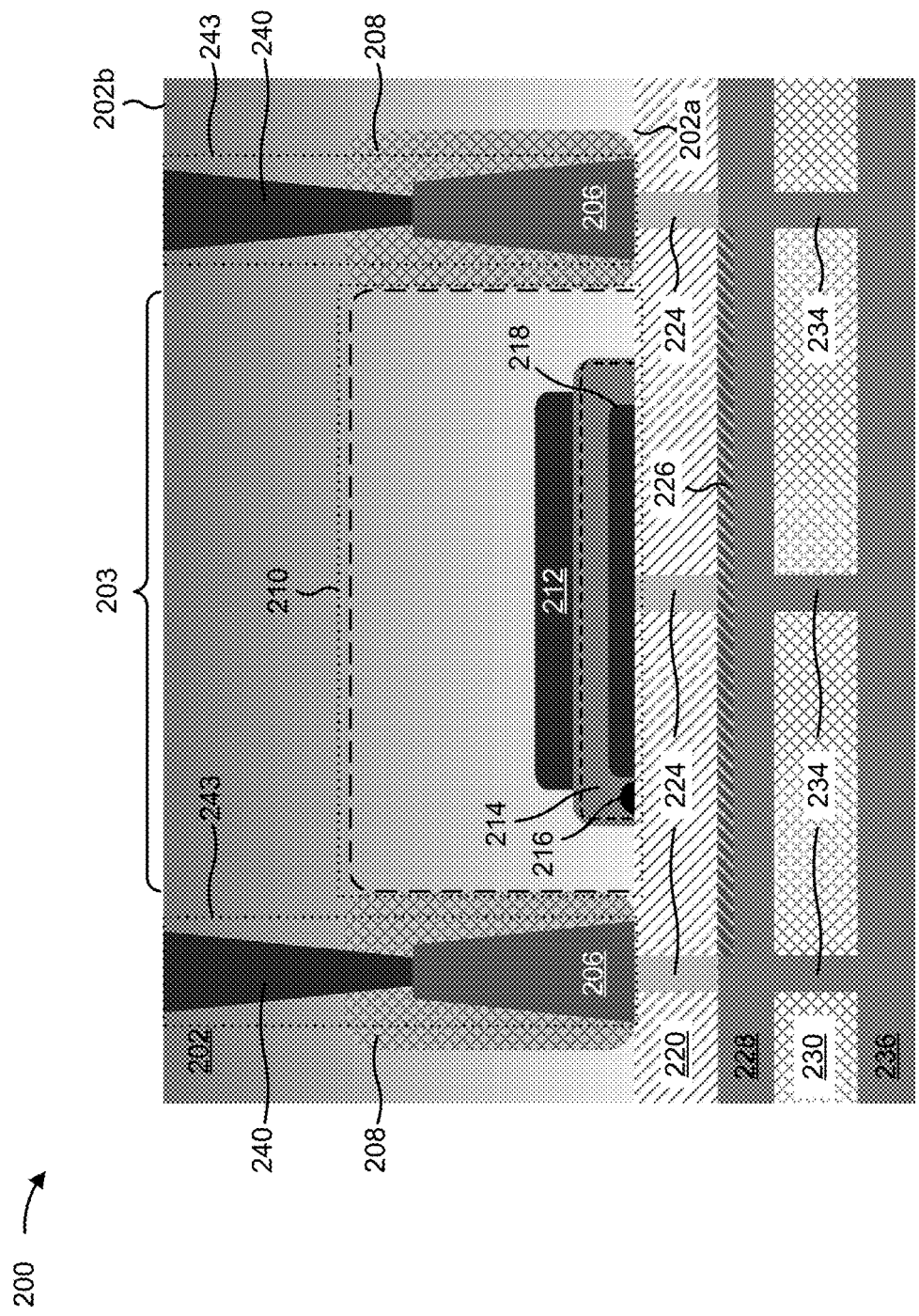
Figure 2S:
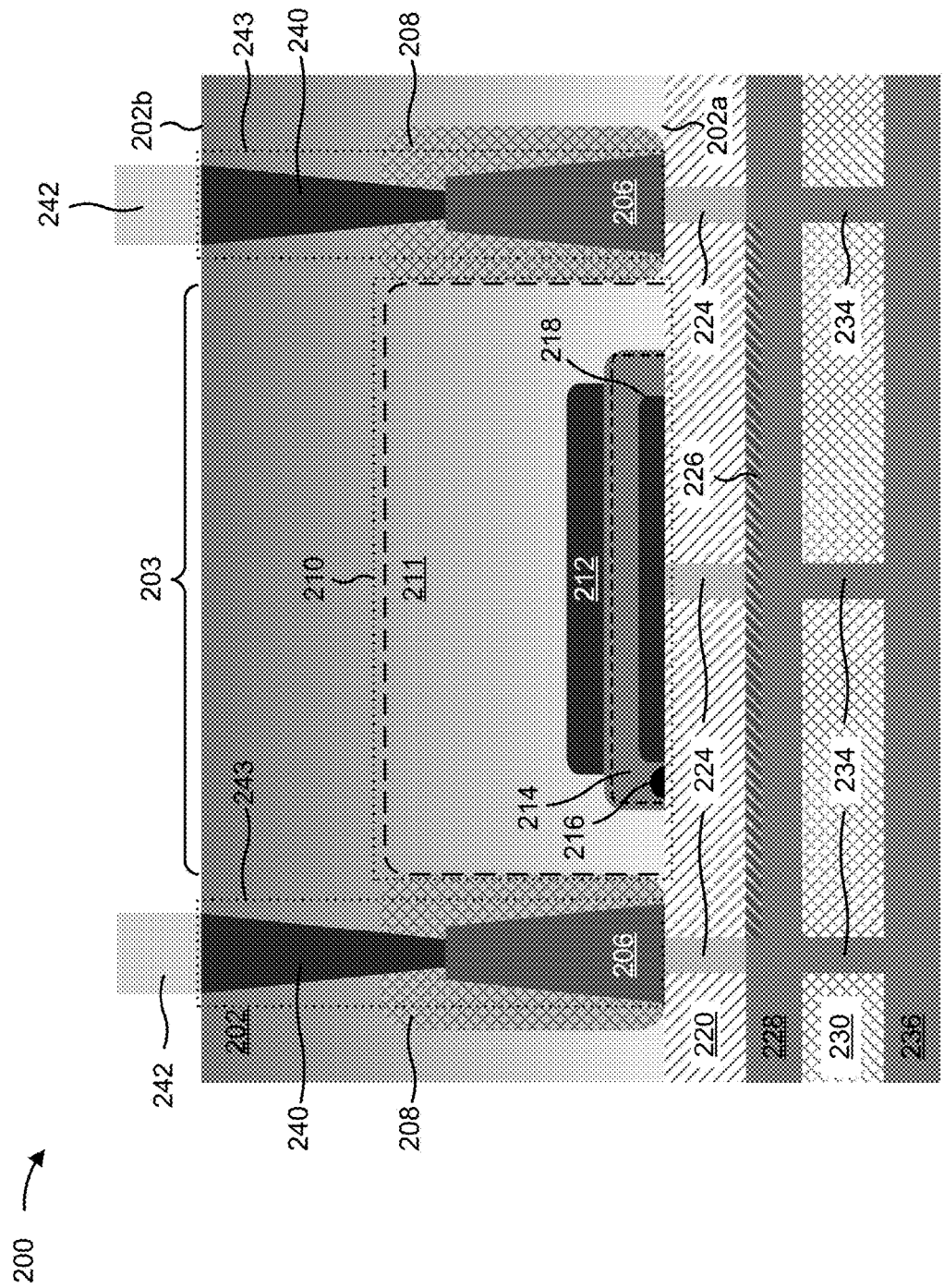
Figure 2T:
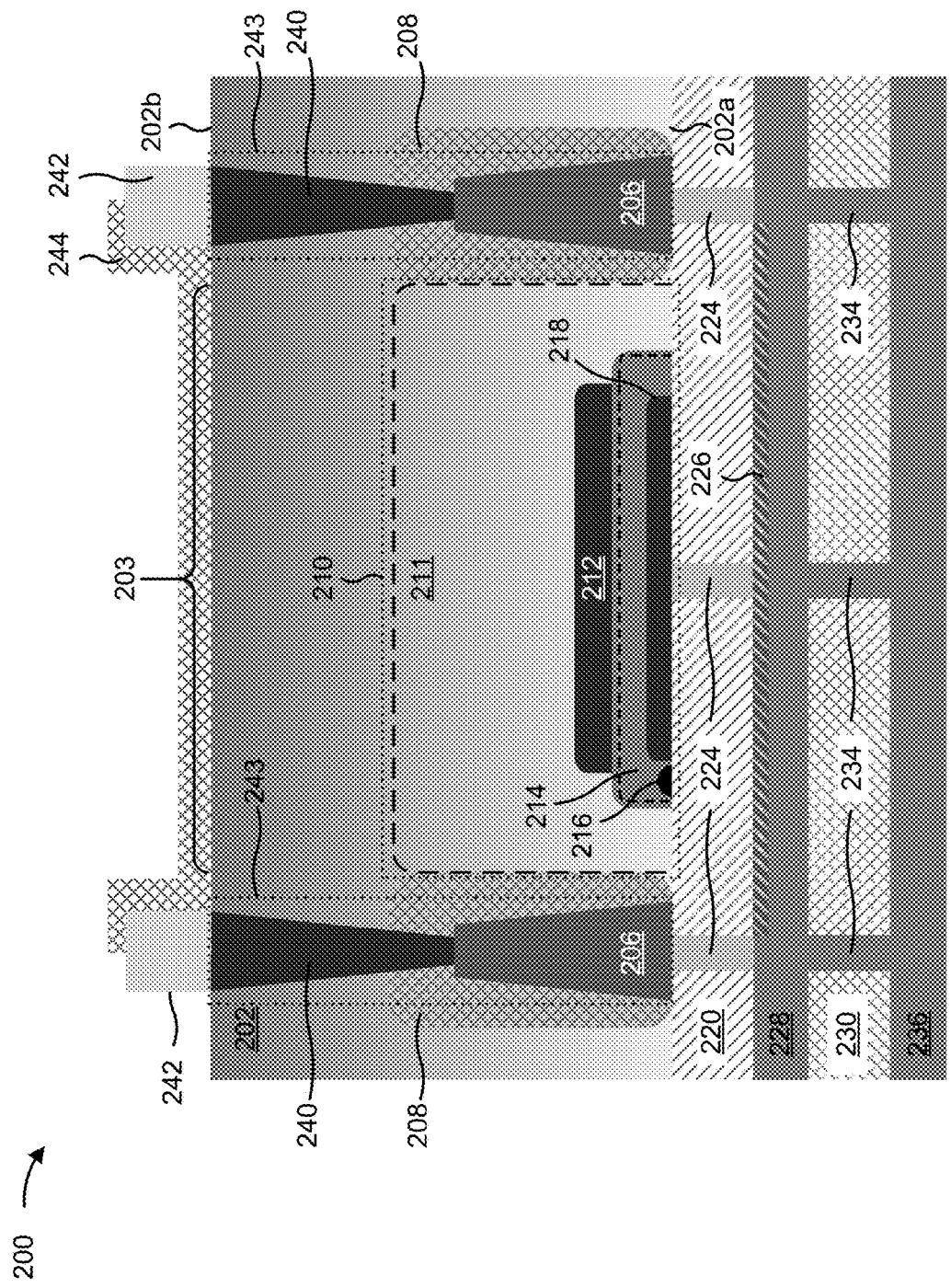

FIGS. 2A-2T are diagrams of an example of forming a semiconductor device 200 including a backside illuminated SPAD with an FDTI structure. The semiconductor device 200 may be included in an image sensor, such as a complementary metal-oxide-semiconductor (CMOS) image sensor or another type of image sensor. In some implementations, the semiconductor device 200 may be included in a pixel array. For example, in some implementations, the semiconductor device 200 may form a pixel in a pixel array of an image sensor.

As shown in FIG. 2A, in a first operation associated with forming semiconductor device 200, a substrate 202 is provided. The substrate 202, may include a semiconductor die substrate, a semiconductor wafer, or another type of substrate in which semiconductor pixels may be formed. In some implementations, the substrate 202 is formed of silicon, a material including silicon, a III-V compound semiconductor material such as gallium arsenide (GaAs), a silicon on insulator (SOI), or another type of semiconductor material that is capable of generating a charge from photons of incident light. In some implementations, the substrate 202 is a p-type substrate (i.e., the substrate 202 may be lightly doped with p-type dopants). In some implementations, as indicated in FIG. 2A, the substrate 202 has a gradient doping profile. As shown in FIG. 2A, the substrate 202 includes a first surface 202a and a second surface 202b.

As shown in FIGS. 2B and 2C, one or more STI elements 206 are formed at sides of a pixel region 203 of the substrate 202, where the one or more STI elements 206 are formed in one or more openings 204 on the first surface 202a of the substrate 202. The pixel region 203 is a region of the substrate 202 in which a SPAD 210 is to be formed, as described below. The STI element 206 is an element to provide isolation for the SPAD 210 (e.g., to reduce optical crosstalk form a neighboring SPAD 210 of the semiconductor device 200). In particular, STI elements 206 may be formed between the pixel region 203 and neighboring pixel regions 203 (not shown in FIGS. 2B and 2C) of the substrate 202. In some implementations, the STI element 206 may include a reflective material to cause the STI element 206 to block light from a neighboring pixel region 203 of the semiconductor device 200 and/or to direct light in the pixel region 203 back toward the SPAD 210. In some implementations, the reflective material can be, for example, a reflective metal or a multi-layer oxide structure in which layers have different refractive indices (e.g., to form a total internal reflection structure).

In some implementations, one or more semiconductor processing tools may be used to form the one or more STI elements 206 in the substrate 202. For example, the deposition tool 102 may form a photoresist layer on the first surface 202a of the substrate 202, the exposure tool 104 may expose the photoresist layer to a radiation source to pattern the photoresist layer, the developer tool 106 may develop and remove portions of the photoresist layer to expose the pattern, and the etch tool 108 may etch the one or more portions of substrate 202 to form one or more openings 204, as shown in FIG. 2B. In some implementations, a photoresist removal tool removes the remaining portions of the photoresist layer (e.g., using a chemical stripper and/or another technique) after the etch tool 108 etches the substrate 202. Next, the deposition tool 102 may fill the openings 204 with a material (e.g., an oxide material such as a silicon oxide ($SiO_x$) or another dielectric material) that provides optical isolation, and the planarization tool may remove excess dielectric material using a CMP technique. FIG. 2C illustrates the semiconductor device 200 after filling of the openings 204 and the planarization. In some implementations, the one or more STI elements 206 may be formed in a grid layout in which the one or more STI elements 206 extend laterally across the substrate 202 and intersect at various locations.

As shown in FIG. 2D, one or more wells 208 (e.g., one or more (deep) p-wells) are formed at the sides of the pixel region 203. A well 208 is a feature to enhance isolation between adjacent SPADs 210. In some implementations, as shown in FIG. 2D, the one or more wells 208 are formed around the one or more STI elements 206.

In some implementations, a semiconductor processing tool such as the implantation tool 112 dopes portions of the substrate 202 using an ion implantation technique to form the one or more wells 208. In these examples, the semiconductor processing tool may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. In some implementations, other techniques and/or types of ion implantation tools are used to form the ion beam. The ion beam may be directed at the portions of the substrate 202 in which the wells 208 are to be formed, thereby doping the substrate 202 to form the wells 208.

As shown in FIG. 2E, a SPAD 210 is formed in the pixel region 203 of the substrate 202. As shown, in some implementations, the SPAD 210 includes a depletion region 211, a p-SPAD layer 212, an n-SPAD layer 214, an n+ layer 216, and a p+ layer 218. In some implementations, the SPAD 210 is formed in an epitaxial layer (e.g., a p-epitaxial layer) of the substrate 202. A multiplication junction region is formed at an interface between the substrate 202 and the p-SPAD layer 212. In operation, the SPAD 210 is reverse biased above a breakdown voltage, and incident photons strike the SPAD 210 from first surface 202a of the substrate 202 to generate carriers. The photon-generated carriers move to the multiplication junction region and trigger an avalanche current that amplifies the signals generated by the photons (e.g., such that detectability of the signals increases).

In some implementations, a semiconductor processing tool such as the implantation tool 112 dopes portions of the substrate 202 using an ion implantation technique to form the p-SPAD layer 212, the n-SPAD layer 214, the n+ layer 216, and the p+ layer 218. That is, the substrate 202 may be doped with a plurality of types of ions to form a p-n junction for the SPAD 210. For example, the substrate 202 may be doped with a p-type dopant to form the p-SPAD layer 212, an n-type dopant to form the n-SPAD layer 214, an n-type dopant to form the n+ layer 216, and a p-type dopant to form the p+ layer 218. In these examples, in association with generating a given layer of the SPAD 210, the semiconductor processing tool may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. In some implementations, other techniques and/or types of ion implantation tools are used to form the ion beam. The ion beam may be directed at a portion of the substrate 202 in which a given layer of the SPAD 210 is to be formed, thereby doping the substrate 202 to form the given layer of the SPAD 210.

As shown in FIG. 2F, a dielectric layer 220 may be formed on the first surface 202a of substrate 202. In some implementations, the dielectric layer 220 may function as a layer used to define contacts 224 associated with the SPAD 210, as described below. In some implementations, a silicon nitride ($SiN_x$), a silicon carbide ($SiC_x$), or a mixture thereof, such as a silicon carbon nitride (SiCN), a silicon oxynitride (SiON), or another type of dielectric material may be used to form the dielectric layer 220. In some implementations, a semiconductor processing tool (e.g., the deposition tool 102) may deposit the dielectric material on the substrate 202 (over the SPAD 210) to form the dielectric layer 220.

As shown in FIGS. 2G and 2H, one or more contacts 224 are formed in one or more openings 222 in the dielectric layer 220 on the first surface 202a of the substrate 202. In particular, as shown in FIGS. 2G and 2H, a first contact 224 may be formed over the SPAD 210 (e.g., to provide electrical connectivity to the SPAD 210, while second and third contacts 224 may be formed over the STI elements 206 (e.g., to provide a ground contact).

In some implementations, one or more semiconductor processing tools may be used to form the one or more contacts 224 in the dielectric layer 220. For example, the deposition tool 102 may form a photoresist layer on the dielectric layer 220, the exposure tool 104 may expose the photoresist layer to a radiation source to pattern the photoresist layer, the developer tool 106 may develop and remove portions of the photoresist layer to expose the pattern, and the etch tool 108 may etch the one or more portions of dielectric layer 220 to form one or more openings 222, as shown in FIG. 2G. In some implementations, a photoresist removal tool removes the remaining portions of the photoresist layer (e.g., using a chemical stripper and/or another technique) after the etch tool 108 etches the dielectric layer 220. Next, the deposition tool 102 may fill the openings 222 with a contact material (e.g., a contact metal), and the planarization tool 110 may remove excess contact material using a CMP technique. FIG. 2H illustrates the semiconductor device 200 after filling of the openings 222 and the planarization.

As shown in FIGS. 2I and 2J, a reflection layer 226 may be formed over the first surface 202a of the substrate 202 (e.g., over the SPAD 210). The reflection layer 226 is a layer to reflect light toward the SPAD 210 in operation of the semiconductor device 200. For example, the reflection layer 226 can reflect any incident light (e.g., acting as a mirror) back toward the SPAD 210, thereby enhancing absorption of light by the SPAD 210 and improving light sensitivity of the semiconductor device 200. In some implementations, the reflection layer 226 includes a metal material, such as copper or another type of metal material with reflective properties.

In some implementations, one or more semiconductor processing tools may be used to form the reflection layer 226. For example, the deposition tool 102 may form the reflection layer 226 over the first surface 202a of the substrate 202 (e.g., on the dielectric layer 220 and the one or more contacts 224), as shown in FIG. 2I. Next, the deposition tool 102 may form a photoresist layer on the reflection layer 226, the exposure tool 104 may expose the photoresist layer to a radiation source to pattern the photoresist layer, the developer tool 106 may develop and remove portions of the photoresist layer to expose the pattern, and the etch tool 108 may etch the one or more portions of reflection layer 226 to remove portions of the reflection layer 226 such that portion over the SPAD 210 remains, as shown in FIG. 2J. In some implementations, a photoresist removal tool removes the remaining portions of the photoresist layer (e.g., using a chemical stripper and/or another technique) after the etch tool 108 etches the reflection layer 226.

In some implementations, as illustrated in FIGS. 2K-2O, a metal stack is formed over the first surface 202a of the substrate 202 after formation of the reflection layer 226. The metal stack includes one or more metal layers associated with routing electrical signals in the semiconductor device 200. In some implementations, the metal stack includes a first metal layer 228, at least one low-K layer 230 (i.e., a layer formed from a material with a low dielectric constant (K), such as $SiO_x$ or $Si_xN_x$), a second metal layer 236, and one or more vias 234 (e.g., for providing routing connections between the first metal layer 228 and the second metal layer 236).

In some implementations, one or more semiconductor processing tools can be used to form the metal stack. For example, as shown in FIG. 2K, a semiconductor processing tool (e.g., the deposition tool 102) may deposit a metal material (e.g., copper) over the substrate 202 (e.g., on the reflection layer 226, the dielectric layer 220, the one or more contacts 224) to form the first metal layer 228. Next, as shown in FIG. 2L, a semiconductor processing tool (e.g., the deposition tool 102) may deposit a low-K material on the first metal layer 228 to form the low-K layer 230. Next, a semiconductor processing tool (e.g., the deposition tool 102) may form a photoresist layer on the low-K layer 230, the exposure tool 104 may expose the photoresist layer to a radiation source to pattern the photoresist layer, the developer tool 106 may develop and remove portions of the photoresist layer to expose the pattern, and the etch tool 108 may etch the one or more portions of low-K layer 230 to form one or more openings 232, as shown in FIG. 2M. In some implementations, a photoresist removal tool removes the remaining portions of the photoresist layer (e.g., using a chemical stripper and/or another technique) after the etch tool 108 etches the low-K layer 230. Next, the deposition tool 102 may fill the one or more openings 232 with a metal material to form one or more vias 234, and the planarization tool 110 may remove excess metal material using a CMP technique. FIG. 2N illustrates the semiconductor device 200 after filling of the openings 232 and the planarization. Next, as shown in FIG. 2O, a semiconductor processing tool (e.g., the deposition tool 102) may deposit another layer of the metal material over the substrate 202 (e.g., on the low-K layer 230 and the one or more vias 234) to form the second metal layer 236. Notably, FIGS. 2K-2O are provided as an example and, in practice, the metal stack may include one or more additional metal layers, one or more additional low-K layers, and/or one or more additional vias (e.g., formed in a similar manner).

As shown in FIG. 2P, after formation of the metal stack, the semiconductor device 200 may be flipped such that further processing can be performed on the second surface 202b of the substrate 202. In some implementations, the wafer/die handling device 214 or another type of device may perform the flipping of the semiconductor device 200.

As shown in FIGS. 2Q and 2R, one or more DTI elements 240 are formed in one or more openings 238 at sides of the pixel region 203 of the substrate 202, where the one or more DTI elements 240 are formed on the second surface 202b of the substrate 202. A DTI element 240 is an element to provide isolation for the SPAD 210 (e.g., to reduce optical crosstalk from a neighboring SPAD 210 of the semiconductor device 200). In particular, DTI elements 240 may be formed between the pixel region 203 and neighboring pixel regions 203 (not shown) of the substrate 202. In some implementations, the DTI element 240 may include a reflective material to cause the DTI element 240 to block light from a neighboring pixel region 203 of the semiconductor device 200 and/or to direct light in the pixel region 203 back toward the SPAD 210. In some implementations, the reflective material can be, for example, a reflective metal or a multi-layer oxide structure in which layers have different refractive indices (e.g., to form a total internal reflection structure).

In some implementations, one or more semiconductor processing tools may be used to form the one or more DTI elements 240 in the substrate 202. For example, the deposition tool 102 may form a photoresist layer on the second surface 202b of the substrate 202, the exposure tool 104 may expose the photoresist layer to a radiation source to pattern the photoresist layer, the developer tool 106 may develop and remove portions of the photoresist layer to expose the pattern, and the etch tool 108 may etch the one or more portions of substrate 202 to form one or more openings 238, as shown in FIG. 2Q. In some implementations, a photoresist removal tool removes the remaining portions of the photoresist layer (e.g., using a chemical stripper and/or another technique) after the etch tool 108 etches the substrate 202. Next, the deposition tool 102 may fill the one or more openings 238 with a material (e.g., an oxide material such as a silicon oxide ($SiO_x$) or another type of dielectric material) that provides optical isolation, and the planarization tool 110 may remove excess material using a CMP technique. FIG. 2R illustrates the semiconductor device 200 after filling of the one or more openings 238 and the planarization. In some implementations, the one or more DTI elements 240 may be formed in a grid layout in which the one or more DTI elements 240 extend laterally across the substrate 202 and intersect at various locations.

In some implementations, as shown in FIGS. 2Q and 2R, the DTI element 240 may extend through the substrate 202 (and the well 208) to the STI element 206. In some implementations, the STI element 206 and the DTI element 240 form a full deep trench isolation (FDTI) structure 243. The FDTI structure 243 is a structure that provides improved isolation of the SPAD 210 in the pixel region 203 (e.g., from a SPAD 210 in a neighboring pixel region 203 of the substrate). For example, the combination of the STI element 206 and the DTI element 240 may improve isolation of the SPAD 210 (e.g., as compared to STI alone or DTI alone). In some implementations, the STI element 206 and the DTI element 240 are formed such that a height of the FDTI structure 243 is approximately equal to a thickness of the substrate 202.

As shown in FIG. 2S, a metal grid structure 242 may be formed on the second surface 202b of the substrate 202 (e.g., over the FDTI structure 243). The metal grid structure 242 is a structure to further improve isolation of the SPAD 210 in the pixel region 203 (e.g., from a SPAD 210 in a neighboring pixel region 203). For example, the metal grid structure 242 may direct light between the SPAD 210 and the neighboring SPAD 210 such that optical crosstalk is reduced and/or such that light sensitivity of the semiconductor device 200 is improved. In some implementations, the metal grid structure 242 includes a metal material, such as tungsten or another type of metal material with reflective properties. In some implementations, the metal grid structure 242 is formed in a grid layout in which the metal grid structure 242 extends laterally across the substrate 202 and intersects at various locations.

In some implementations, one or more semiconductor processing tools may be used to form the metal grid structure 242. For example, the deposition tool 102 may form a photoresist layer on the second surface 202b of the substrate 202 (e.g., over the DTI elements 240), the exposure tool 104 may expose the photoresist layer to a radiation source to pattern the photoresist layer, and the developer tool 106 may develop and remove portions of the photoresist layer to expose the pattern. Next, the deposition tool 102 may form the metal grid structure 242 over the second surface 202b of the substrate 202 by filling voids in the pattern, after which a photoresist removal tool removes the remaining portions of the photoresist layer (e.g., using a chemical stripper and/or another technique).

As shown in FIG. 2T, in some implementations, a filter 244 may be formed on the second surface 202b of the substrate 202 over the SPAD 210. In some implementations, the filter 244 is a layer (e.g., a film or a thin film) to filter incident light to allow a particular wavelength of the incident light to pass to SPAD 210 (and blocks other wavelengths from passing). In some implementations, a thickness of the filter 244 may be designed to control (e.g., extend) an integration time of the SPAD 210 (e.g., a total integration time). In some implementations, the filter 244 may comprise, for example, titanium or titanium nitride. In some implementations, thicknesses of the filter 244 may vary among SPADs 210 of the semiconductor device 200, as described below in association with FIGS. 3A-3D. In some implementations, a semiconductor processing tool (e.g., the deposition tool 102) may deposit the filter 244 using, for example, a CVD technique, a PVD technique, an ALD technique, or another type of deposition technique.

In this way, the semiconductor device 200 including a SPAD 210 arranged for illumination at a back surface (i.e., the first surface 202a) of the substrate 202 may be fabricated to include an FDTI structure 243 between the SPAD 210 and a neighboring SPAD 210 of the semiconductor device 200, where the FDTI structure 243 includes an STI element 206 at the back surface of the substrate 202 and a DTI element 240 at a front surface (i.e., second surface 202b) of the substrate 202. Further, the semiconductor device 200 includes the reflection layer 226 below the back surface of the substrate 202 (e.g., to reflect light toward the SPAD 210) and the metal grid structure 242 on the front surface of the substrate 202. In some implementations, the semiconductor device 200 may further include the filter 244 over the SPAD 210 on the front surface of the substrate 202 (e.g., to control an integration time of the SPAD 210).

The number and arrangement of components, structures, and/or layers shown in FIGS. 2A-2T are provided as one or more examples. In practice, there may be additional components, structures, and/or layers; fewer components, structures, and/or layers; different components, structures, and/or layers; and/or differently arranged components, structures, and/or layers than those shown in FIGS. 2A-2T. That is, as indicated above, FIGS. 2A-2T are provided as an example, and other examples may differ from what is described with regard to FIGS. 2A-2T.

Figure 3A:
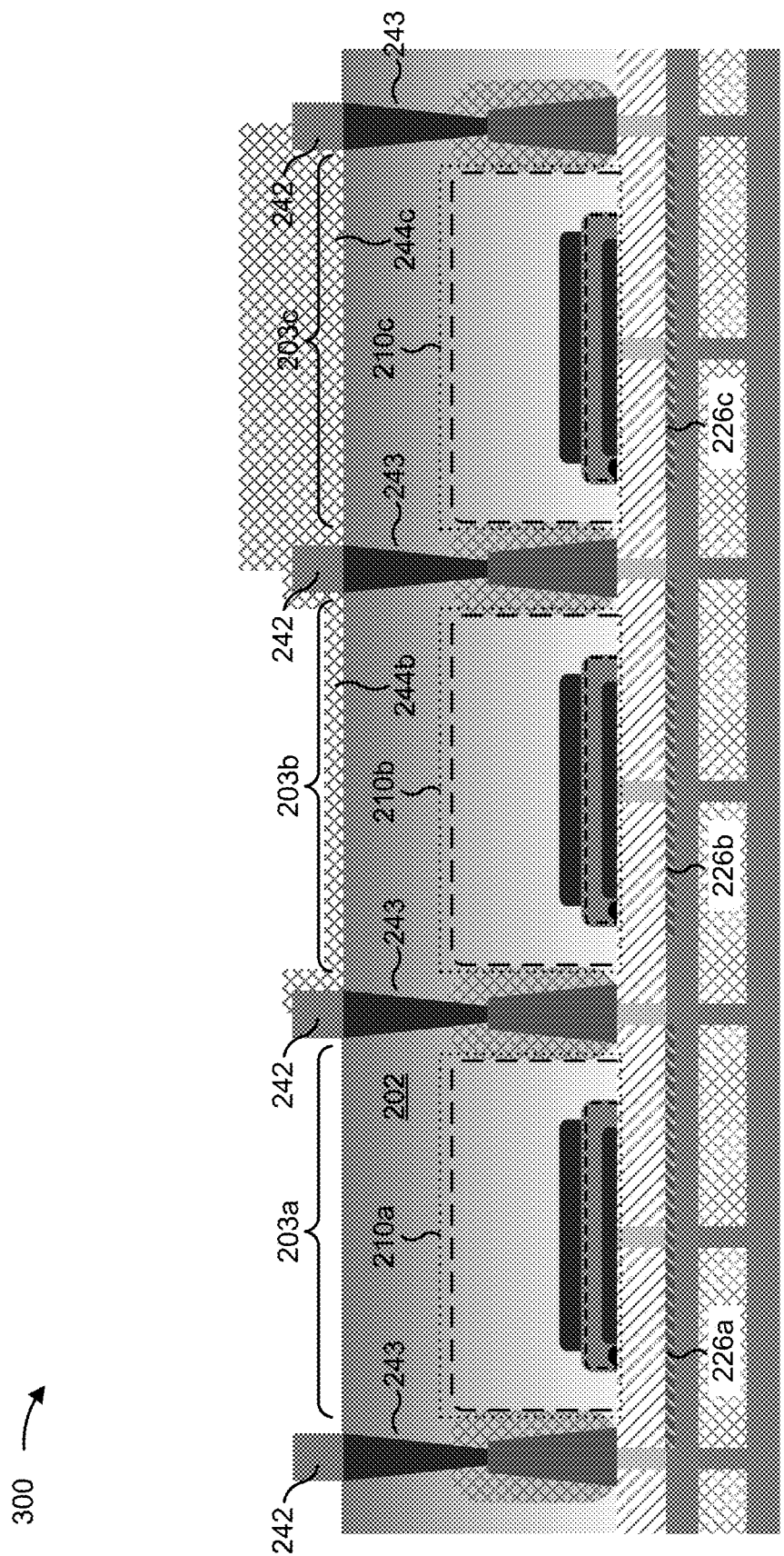

FIG. 3A is a diagram illustrating an example semiconductor device 300 including backside illuminated SPADs 210 with FDTI structures 243 and filters 244 of differing thicknesses.

As shown in FIG. 3A, the semiconductor device 300 includes a SPAD 210a in a pixel region 203a of a substrate 202, a SPAD 210b in a pixel region 203b of the substrate 202, and a SPAD 210c in a pixel region 203c of the substrate 202. Here, the SPADs 210a, 210b, and 210c are illuminated at a back surface of the substrate 202. As further shown, the semiconductor device 300 includes FDTI structures 243 between the pixel regions 203. As further shown, the semiconductor device 300 includes a reflection layer 226 including a first portion 226a arranged to reflect light toward the SPAD 210a, a second portion 226b arranged to reflect light toward the SPAD 210b, and a third portion 226c arranged to reflect light toward the SPAD 210c. As further shown, the semiconductor device 300 includes a metal grid structure 242 associated with isolating the SPADs 210. As further shown in FIG. 3A, the semiconductor device 300 includes a filter 244b over the SPAD 210b and a filter 244c over the SPAD 210c (no filter is over the SPAD 210a). Notably, a thickness of the filter 244b differs from (e.g., is less than) a thickness of the filter 244c.

In some implementations, as illustrated in FIG. 3A, a thickness of the filter 244 over a first SPAD 210 is different from a thickness of a filter 244 that is over another SPAD 210 (e.g., a neighboring SPAD 210). In some implementations, the thickness of the filter 244 may vary among SPADs 210. In some implementations, such a design improves coverage in a particular wavelength band, such as the infrared band. For example, with reference to FIG. 3B, the line labeled "Infrared (430 THz-300 GHz)" refers to an incident infrared signal over a given period of time. Further, the line labeled "$1^{st}$ SPAD 210a (without filter 244)" and the line labeled "$2^{nd}$ SPAD 210a (without filter 244)" indicate that different SPADs 210a without filters 244 can be designed to receive different frequencies of light. In FIG. 3B, the shaded rectangles indicate integration times of the first SPAD 210a and the second SPAD 210a within the period. However, in the example shown in FIG. 3B, for infrared light (or other low frequency light), the first SPAD 210a and the second SPAD 210a without the filter 244 may miss a portion of the incident optical signal in the frequency band.

In some implementations, the filter 244 may be used to increase integration time of a SPAD 210 to improve coverage (e.g., to avoid missing a portion of the optical signal). For example, with reference to FIG. 3C, the line labeled "Infrared (430 THz-300 GHz)" refers to an incident infrared signal over a given period of time. Further, the line labeled "SPAD 210a (without filter 244)" and the line labeled "SPAD 210b/c (with filter 244b/c)" indicate that SPAD 210a without filter 244 and the SPAD 210b/c with the filter 244b/c (e.g., the SPAD 210b with filter 244b or the SPAD 210c with filter 244c) can be used to receive different frequencies of light. In FIG. 3C, the shaded rectangles indicate integration times of the SPAD 210a and the SPAD 210b/c within the period. In this example, as illustrated in FIG. 3C, for the infrared light (or other low frequency light), the first SPAD 210a may miss the portion of the optical signal, but the SPAD 210b/c with the filter 244b/c may have an extended integration time (e.g., due to the inclusion of the filter 244b/c) that prevents the SPAD 210b/c from missing the portion of the optical signal, thereby improving coverage in the frequency band.

In some implementations, a size of a SPAD area of a given SPAD 210 may be different from a size of a SPAD area of another SPAD 210 (e.g., a neighboring SPAD 210). For example, a first SPAD 210 may have a comparatively smaller SPAD area than that of a second SPAD 210. In some implementations, these so-called large and small SPAD areas can be designed so different frequencies of incident light (e.g., such as LED light) can be received. For example, with reference to FIG. 3D, the line labeled "Infrared (430 THz-300 GHz)" refers to an incident infrared signal over a given period of time. Further, the line labeled "SPAD 210 (with small SPAD area)" and the line labeled "SPAD 210 (with large SPAD area)" indicate that different SPAD 210s can be used to receive different frequencies of light. In FIG. 3D, the shaded rectangles indicate integration times of the SPAD 210 with the small SPAD area and the SPAD with the large SPAD area within the period. In this example, as illustrated in FIG. 3D, for the infrared light (or other low frequency light), the SPAD 210 with the small SPAD may miss the portion of the optical signal at a given frequency, but the SPAD with the large SPAD area may have an extended integration time that allows the SPAD 210 with the large SPAD area to receive the portion of the optical signal, thereby improving coverage in the frequency band.

As indicated above, FIGS. 3A-3D are provided as examples. Other examples may differ from what is described with regard to FIGS. 3A-3D.

Figure 4A:
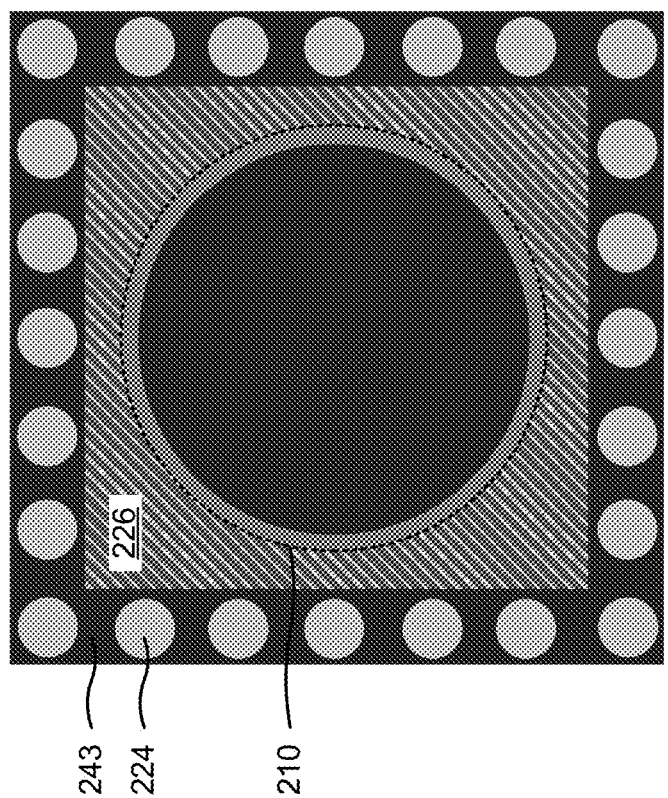
FIGS. 4A and 4B are diagrams illustrating top views of example semiconductor devices including backside illuminated SPADs with FDTI structures.
Figure 4B:
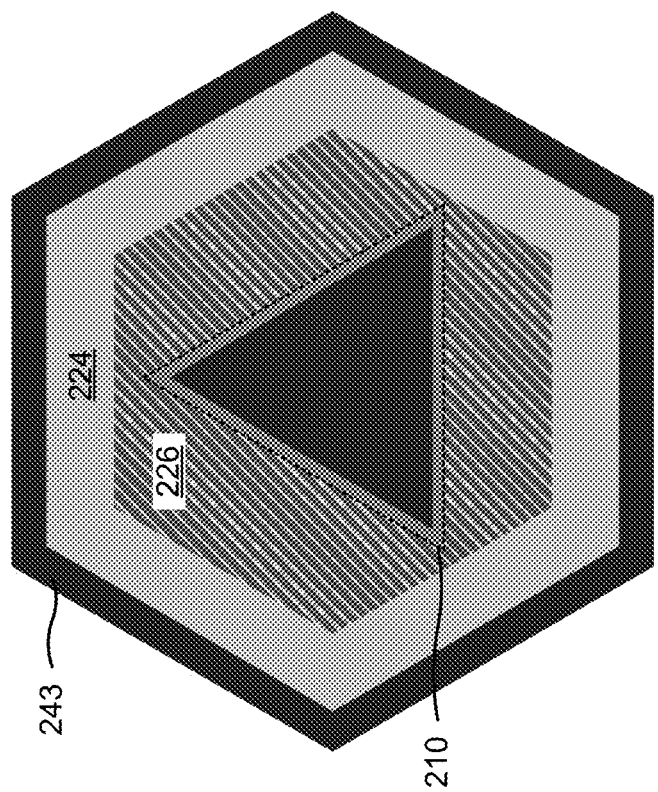

FIGS. 4A and 4B are diagrams illustrating top views of example semiconductor devices including backside illuminated SPADs 210 with FDTI structures 243. Notably, layers of the semiconductor device 200 other than those labeled are omitted in FIGS. 4A and 4B (and treated as transparent) for the purpose of clarity.

In some implementations, as shown in FIGS. 4A and 4B, the FDTI structure 243 may be part of a sealing structure that at least partially surrounds the SPAD 210. For example, as shown in FIGS. 4A and 4B, in some implementations, the FDTI structure 243 and one or more contacts 224 of the semiconductor device 200 form a sealing structure that at least partially surrounds the SPAD 210. In some implementations, the sealing structure can serve to further reduce optical crosstalk between the SPAD 210 and one or more neighboring SPADs 210.

In some implementations, the SPAD 210 can have a round shape or can have any type of polygonal shape (e.g., a round shape is shown in FIG. 4A, a triangular shape is shown in FIG. 4B). Similarly, the sealing structure formed by the FDTI structure 243 and the one or more contacts 224 can have a round shape or any polygonal shape (e.g., a square shape is shown in FIG. 4A, a hexagonal shape is shown in FIG. 4B). In some implementations, an area of the reflection layer 226 under the SPAD 210 is greater than or equal to an open area in the center of the sealing structure formed by the FDTI structure 243 and the one or more contacts 224.

As indicated above, FIGS. 4A and 4B are provided as examples. Other examples may differ from what is described with regard to FIGS. 4A and 4B.

Figure 5:
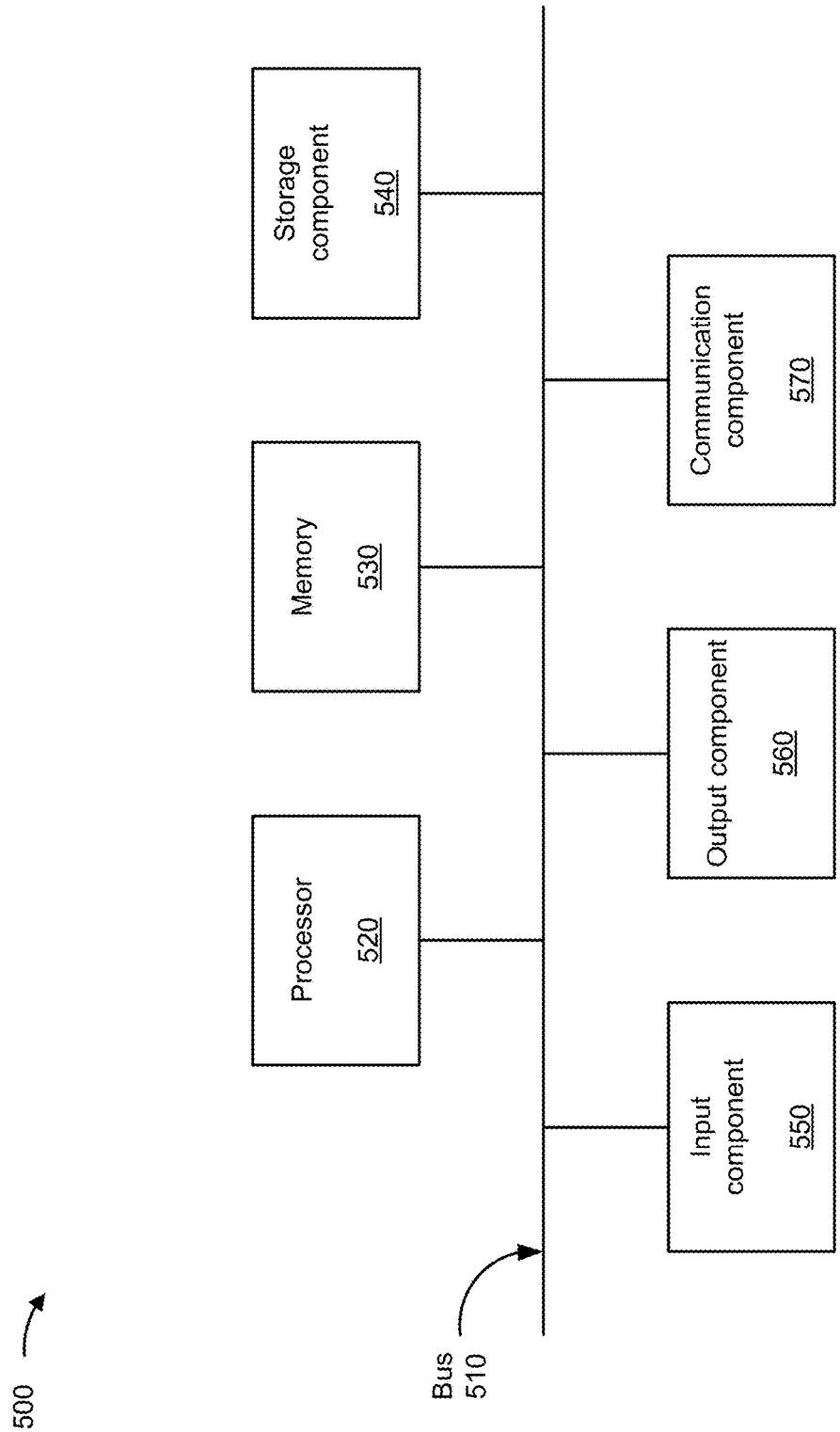
FIG. 5 is a diagram of example components of one or more devices of FIG. 1.

FIG. 5 is a diagram of example components of a device 500. In some implementations, one or more of the semiconductor processing tools 102-112 and/or the wafer/die handling device 114 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, an actuator, and/or the like. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, an antenna, and/or the like.

Device 500 may perform one or more processes described herein. For example, a non-transitory computer-readable medium (e.g., memory 530 and/or storage component 540) may store a set of instructions (e.g., one or more instructions, code, software code, program code, and/or the like) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
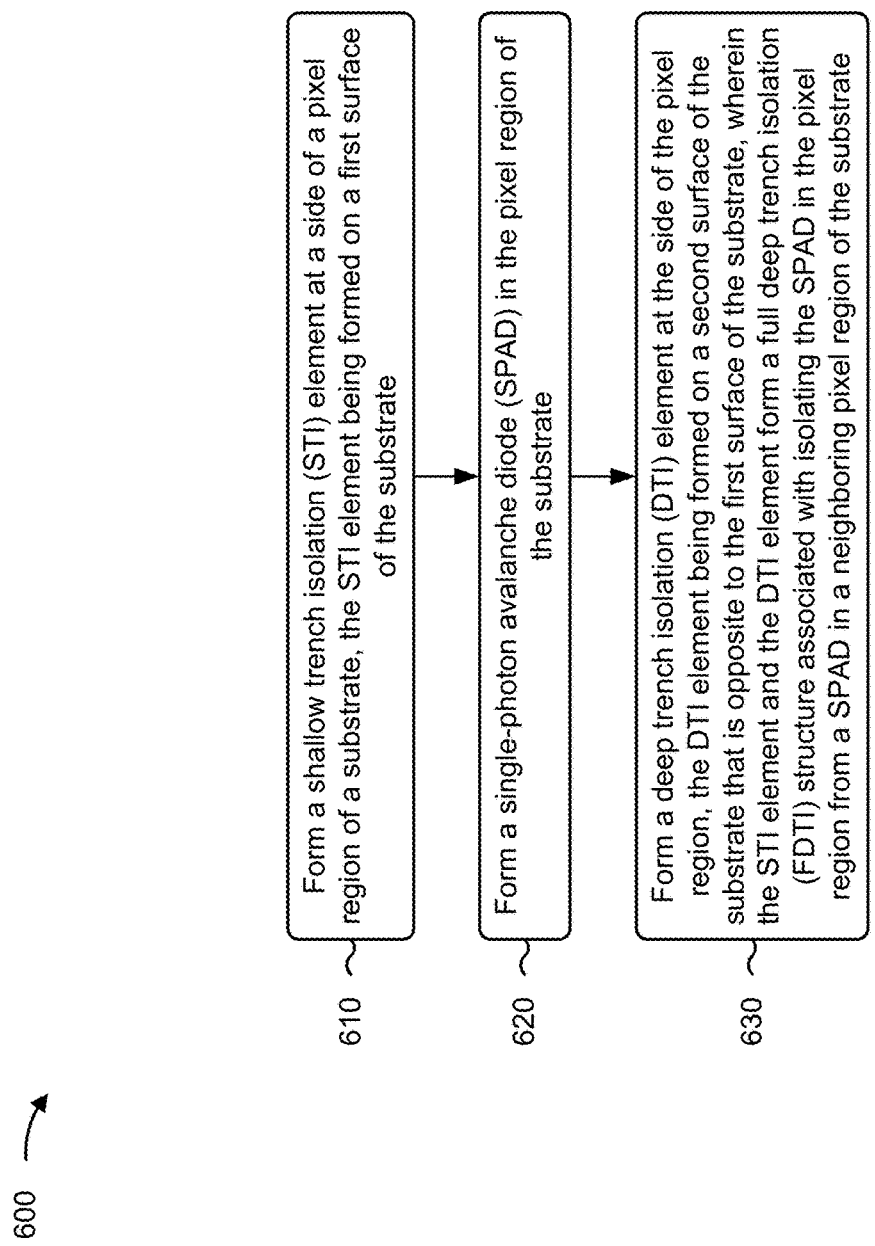
FIG. 6 is a flowchart of an example process relating to forming a semiconductor device including a backside illuminated SPAD with an FDTI structure.

FIG. 6 is a flowchart of an example process 600 relating to forming a semiconductor device including a backside illuminated SPAD with an FDTI structure. In some implementations, one or more process blocks of FIG. 6 may be performed by a semiconductor processing tool (e.g., one or more of the semiconductor processing tools 102-112 described above). Additionally, or alternatively, one or more process blocks of FIG. 6 may be performed by one or more components of device 500, such as processor 520, memory 530, storage component 540, input component 550, output component 560, and/or communication component 670.

As shown in FIG. 6, process 600 may include forming an STI element at a side of a pixel region of a substrate, the STI element being formed on a first surface of the substrate (block 610). For example, a semiconductor processing tool (e.g., the deposition tool 102) may form an STI element 206 at a side of a pixel region 203 of a substrate 202, the STI element 206 being formed on a first surface 202a of the substrate 202, as described above.

As further shown in FIG. 6, process 600 may include forming a SPAD in the pixel region of the substrate (block 620). For example, a semiconductor processing tool (e.g., the implantation tool 112) may form a SPAD 210 in the pixel region 203 of the substrate 202, as described above.

As further shown in FIG. 6, process 600 may include forming a DTI element at the side of the pixel region, the DTI element being formed on a second surface of the substrate that is opposite to the first surface of the substrate, wherein the STI element and the DTI element form an FDTI structure associated with isolating the SPAD in the pixel region from a SPAD in a neighboring pixel region of the substrate (block 630). For example, a semiconductor processing tool (e.g., the deposition tool 102) may form a DTI element 240 at the side of the pixel region 203, the DTI element 240 being formed on a second surface 202b of the substrate 202 that is opposite to the first surface 202a of the substrate 202, wherein the STI element 206 and the DTI element 240 form a full deep trench isolation (FDTI) structure 243 associated with isolating the SPAD 210 in the pixel region 203 from a SPAD 210 in a neighboring pixel region 203 of the substrate 202, as described above.

Process 600 may include additional implementations, such as any single implementation or any combination of implementations described below and/or in connection with one or more other processes described elsewhere herein.

In a first implementation, process 600 includes forming a contact 224 on the first surface 202a of the substrate 202.

In a second implementation, alone or in combination with the first implementation, process 600 includes forming a reflective layer 226 over the first surface 202a of the substrate 202.

In a third implementation, alone or in combination with one or more of the first and second implementations, process 600 includes forming a metal stack over the reflective layer 226, the metal stack comprising at least a first metal layer 228.

In a fourth implementation, alone or in combination with one or more of the first through third implementations, process 600 includes forming a metal grid structure 242 on the second surface 202b of the substrate 202, the metal grid structure 242 being formed over the DTI element 240.

In a fifth implementation, alone or in combination with one or more of the first through fourth implementations, process 600 includes forming a filter 244 on the second surface 202b of the substrate 202, the filter 244 being formed over the SPAD 210.

In a sixth implementation, alone or in combination with one or more of the first through fifth implementations, at least one of the STI element 206 or the DTI element 240 comprises a reflective material.

In a seventh implementation, alone or in combination with one or more of the first through sixth implementations, the STI element 206 and the DTI element 240 are formed such that a height of the FDTI structure 243 is approximately equal to a thickness of the substrate 202.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a SPAD arranged for BSI with full deep trench isolation can be provided. In some implementations, an FDTI structure may be formed between the SPAD and a neighboring SPAD of the semiconductor device to provide isolation of the SPAD from the neighboring SPAD, thereby reducing or eliminating optical crosstalk. In some implementations, the FDTI structure includes an STI element at a back surface of the substrate and a DTI element at a front surface of the substrate. In some implementations, since metal routing does not block incident light, PDP of the SPAD arranged for BSI with FDTI is improved by approximately 30% as compared to an FSI-SPAD (with STI only). In some implementations, the backside illuminated SPAD with FDTI can be used in, for example, an application that uses infrared light while achieving high sharpness. For example, for 940 nm light, the back side illuminated SPAD with FDTI may achieve an MTF of greater than 50% at Ny/2.

As described in greater detail above, some implementations described herein provide a semiconductor device, a method of manufacturing a semiconductor device, and a pixel array.

In some implementations, the semiconductor device includes a SPAD arranged for illumination at a back surface of a substrate. In some implementations, the semiconductor device includes an FDTI structure between the SPAD and a neighboring SPAD of the semiconductor device. Here, the FDTI may be associated with isolating the SPAD from the neighboring SPAD. In some implementations, the FDTI structure includes an STI element at the back surface of the substrate and a DTI element at a front surface of the substrate.

In some implementations, the method includes forming an STI element at a side of a pixel region of a substrate, the STI element being formed on a first surface of the substrate. In some implementations, the method includes forming a SPAD in the pixel region of the substrate. In some implementations, the method includes forming a DTI element at the side of the pixel region, the DTI element being formed on a second surface of the substrate that is opposite to the first surface of the substrate. In some implementations, the STI element and the DTI element form an FDTI structure associated with isolating the SPAD in the pixel region from a SPAD in a neighboring pixel region of the substrate.

In some implementations, a pixel array includes a first avalanche photodiode in a first pixel region of a substrate, the first avalanche photodiode being arranged for illumination at a back surface of the substrate. In some implementations, the pixel array includes a second avalanche photodiode in a second pixel region of the substrate, the second avalanche photodiode being arranged for illumination at the back surface of the substrate. In some implementations, the pixel array includes an FDTI structure associated with isolating the first avalanche photodiode from the second avalanche photodiode, the FDTI structure being formed between the first pixel region and the second pixel region. In some implementations, the FDTI structure includes an STI element and a DTI element. In some implementations, the pixel array includes a reflection layer including a first portion arranged to reflect light toward the first avalanche photodiode and a second portion arranged to reflect light toward the second avalanche photodiode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a single-photon avalanche diode (SPAD) arranged for illumination at a first surface of a substrate,
        wherein the SPAD comprises a depletion region;
    a full deep trench isolation (FDTI) structure between the SPAD and a neighboring SPAD of the semiconductor device,
        wherein the FDTI structure is associated with isolating the SPAD from the neighboring SPAD,
        wherein the FDTI structure includes:
            a shallow trench isolation (STI) element at the first surface of the substrate, and
            a deep trench isolation (DTI) element at a second surface of the substrate,
                wherein the DTI element extends to the STI element;
    a filter over the SPAD on the second surface of the substrate; and
    a well around the STI element and partially around the DTI element,
        wherein a thickness of the depletion region is approximately equal to a thickness of the well.

2. The semiconductor device of claim 1, further comprising at least one of:
    a reflection layer below the first surface of the substrate; or
    a metal grid structure on the second surface of the substrate.

3. The semiconductor device of claim 2, further comprising:
    a dielectric layer between the reflection layer and the SPAD.

4. The semiconductor device of claim 1, wherein at least one of the STI element or the DTI element comprises a reflective material.

5. The semiconductor device of claim 1, wherein a height of the FDTI structure is approximately equal to a thickness of the substrate.

6. The semiconductor device of claim 1, wherein a thickness of the filter over the SPAD is different from a thickness of another filter that is over the neighboring SPAD on the second surface of the substrate.

7. The semiconductor device of claim 1, wherein the FDTI structure and at least a portion of a contact of the semiconductor device form a sealing structure that at least partially surrounds the SPAD.

8. The semiconductor device of claim 1, wherein the SPAD is arranged on the first surface of the substrate, and wherein the second surface of the substrate is between the filter and the SPAD.

9. The semiconductor device of claim 1, wherein a bottommost surface of the well is level with a bottommost surface of the STI element.

10. The semiconductor device of claim 1, further comprising:
    one or more contracts on the first surface of the substrate.

11. A method, comprising:
    forming a shallow trench isolation (STI) element at a side of a pixel region of a substrate,
        wherein the STI element is formed on a first surface of the substrate;
    forming a well around the STI element;
    forming a first single-photon avalanche diode (SPAD) in the pixel region of the substrate,
        wherein the SPAD is formed on the first surface of the substrate,
        wherein the SPAD comprises a depletion region, and
        wherein a thickness of the depletion region is approximately equal to a thickness of the well;

forming an opening through a second surface of the substrate at the side of the pixel region and into the well,
    wherein the second surface of the substrate is opposite the first surface of the substrate, and
    wherein the opening extends to the STI element;
forming a deep trench isolation (DTI) element in the opening,
    wherein the STI element and the DTI element form a full deep trench isolation (FDTI) structure associated with isolating the first SPAD from a second SPAD in a neighboring pixel region of the substrate, and
    wherein the well partially surrounds the DTI element; and
forming a filter on the second surface of the substrate, wherein the filter is formed over the first SPAD.

12. The method of claim 11, further comprising forming a contact on the first surface of the substrate.

13. The method of claim 11, further comprising:
forming a reflective layer over the first surface of the substrate; and
forming a metal stack over the reflective layer, the metal stack comprising at least one metal layer.

14. The method of claim 11, further comprising:
forming a metal grid structure on the second surface of the substrate and over the DTI element.

15. The method of claim 11, wherein at least one of the STI element or the DTI element comprises a reflective material.

16. The method of claim 11, wherein the STI element and the DTI element are formed such that a height of the FDTI structure is approximately equal to a thickness of the substrate.

17. A pixel array, comprising:
a first avalanche photodiode in a first pixel region of a substrate,
    wherein the first avalanche photodiode is arranged for illumination at a first surface of the substrate, and
    wherein the first avalanche photodiode comprises a depletion region;
a second avalanche photodiode in a second pixel region of the substrate,
    wherein the second avalanche photodiode is arranged for illumination at the first surface of the substrate;
a full deep trench isolation (FDTI) structure associated with isolating the first avalanche photodiode from the second avalanche photodiode,
    wherein the FDTI structure is formed between the first pixel region and the second pixel region,
    wherein the FDTI structure includes a shallow trench isolation (STI) element at the first surface of the substrate and a deep trench isolation (DTI) element at a second surface of the substrate, and
    wherein the DTI element extends to the STI element;
a well around the STI element and partially around the DTI element,
    wherein a thickness of the depletion region is approximately equal to a thickness of the well;
a reflection layer including a first portion arranged to reflect light toward the first avalanche photodiode and a second portion arranged to reflect light toward the second avalanche photodiode; and
a filter over the first avalanche photodiode,
    wherein the filter is arranged on the second surface of the substrate.

18. The pixel array of claim 17, wherein the filter is a first filter; and
wherein the pixel array further comprises:
    a second filter over the second avalanche photodiode and arranged on the second surface on of the substrate.

19. The pixel array of claim 18, wherein a thickness of the first filter is different from a thickness of the second filter.

20. The pixel array of claim 17, further comprising a metal grid structure associated with isolating the first avalanche photodiode from the second avalanche photodiode,
    wherein the metal grid structure includes a metal grid portion between the first pixel region and the second pixel region on the second surface of the substrate.

* * * * *